(12) United States Patent
Lee et al.

(10) Patent No.: US 11,599,228 B2
(45) Date of Patent: Mar. 7, 2023

(54) ELECTRONIC DEVICE INCLUDING A SENSOR FOR AN ACTIVE PEN

(71) Applicant: Samsung Display Co., Ltd., Yongin-si (KR)

(72) Inventors: Seongjun Lee, Seoul (KR); Suin Kim, Asan-si (KR); Jaseung Ku, Seoul (KR); Suyul Seo, Incheon (KR); Gi-Na Yoo, Cheonan-si (KR); Dong-Hwan Lee, Yongin-si (KR); Jaeik Lim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 23 days.

(21) Appl. No.: 17/249,720

(22) Filed: Mar. 10, 2021

(65) Prior Publication Data

US 2021/0373705 A1 Dec. 2, 2021

(30) Foreign Application Priority Data

May 27, 2020 (KR) .......................... 10-2020-0063703

(51) Int. Cl.
*G06F 3/044* (2006.01)
*G06F 3/041* (2006.01)
*H01L 27/32* (2006.01)
*H01L 51/52* (2006.01)

(52) U.S. Cl.
CPC .......... *G06F 3/0443* (2019.05); *G06F 3/0412* (2013.01); *G06F 3/0446* (2019.05); *H01L 27/323* (2013.01); *H01L 27/3276* (2013.01); *H01L 51/5253* (2013.01); *G06F 2203/04111* (2013.01)

(58) Field of Classification Search
None
See application file for complete search history.

(56) References Cited

U.S. PATENT DOCUMENTS

| | | | |
|---|---|---|---|
| 9,557,849 B2 | 1/2017 | Han et al. |
| 9,632,379 B2 | 4/2017 | Kim et al. |
| 9,632,609 B2 | 4/2017 | Tsukamoto et al. |
| 9,805,690 B2 | 10/2017 | Kang et al. |

(Continued)

FOREIGN PATENT DOCUMENTS

| | | |
|---|---|---|
| CN | 104656979 B | 3/2018 |
| CN | 108700972 A | 10/2018 |

(Continued)

*Primary Examiner* — Carl Adams
(74) *Attorney, Agent, or Firm* — Lewis Roca Rothgerber Christie LLP

(57) ABSTRACT

An electronic device includes: a display layer; and a sensor layer on the display layer, the sensor layer including: a first sensing electrode having a first sub-sensing electrode and a second sub-sensing electrode electrically separated from the first sub-sensing electrode; and a second sensing electrode intersecting the first sensing electrode, wherein the sensor layer is configured to sense an external input through a change in mutual capacitance between the first sensing electrode and the second sensing electrode, and the sensor layer is further configured to sense an input by an active pen through a change in capacitance of each of the first sub-sensing electrode, the second sub-sensing electrode, and the second sensing electrode.

12 Claims, 22 Drawing Sheets

(56) References Cited

U.S. PATENT DOCUMENTS

| | | | |
|---|---|---|---|
| 9,830,025 | B2 | 11/2017 | Han et al. |
| 10,061,414 | B2 | 8/2018 | Lee et al. |
| 10,191,580 | B2 | 1/2019 | Lee et al. |
| 10,209,813 | B2 | 2/2019 | Yao et al. |
| 10,254,908 | B2 | 4/2019 | Na et al. |
| 10,268,320 | B2 | 4/2019 | Westerman et al. |
| 10,331,237 | B2 | 6/2019 | Nakamura |
| 10,345,966 | B2 * | 7/2019 | Han .................. G06F 3/0443 |
| 10,433,419 | B2 | 10/2019 | Nakamura et al. |
| 10,572,092 | B2 | 2/2020 | Shimizu |
| 10,684,500 | B2 | 6/2020 | Shishido et al. |
| 10,719,156 | B2 | 7/2020 | Li et al. |
| 2009/0091248 | A1 * | 4/2009 | Kim .................. H05B 33/28 |
| | | | 313/504 |
| 2017/0192574 | A1 | 7/2017 | Koike et al. |
| 2019/0129567 | A1 | 5/2019 | Rhe et al. |

FOREIGN PATENT DOCUMENTS

| | | |
|---|---|---|
| CN | 109753181 A | 5/2019 |
| CN | 106527821 B | 6/2019 |
| CN | 105487728 B | 8/2019 |
| CN | 110580118 A | 12/2019 |
| JP | 5882538 B2 | 3/2016 |
| KR | 10-2011-0083957 A | 7/2011 |
| KR | 10-2012-0023288 A | 3/2012 |
| KR | 10-2015-0067432 A | 6/2015 |
| KR | 10-1579609 B1 | 12/2015 |
| KR | 10-2016-0026069 A | 3/2016 |
| KR | 10-1634468 B1 | 6/2016 |
| KR | 10-2016-0099791 A | 8/2016 |
| KR | 10-2016-0140430 A | 12/2016 |
| KR | 10-2017-0054972 A | 5/2017 |
| KR | 10-1858825 B1 | 5/2018 |
| KR | 10-1873177 B1 | 6/2018 |
| KR | 10-2019-0041962 A | 4/2019 |
| KR | 10-2019-0047549 A | 5/2019 |
| KR | 10-2019-0058724 A | 5/2019 |
| KR | 10-2019-0114945 A | 10/2019 |
| KR | 10-2029710 B1 | 10/2019 |
| KR | 10-2049261 B1 | 11/2019 |
| KR | 10-2020-0018794 A | 2/2020 |
| KR | 10-2078650 B1 | 2/2020 |
| KR | 10-2081606 B1 | 2/2020 |
| KR | 10-2082409 B1 | 2/2020 |

* cited by examiner

ELECTRONIC DEVICE INCLUDING A SENSOR FOR AN ACTIVE PEN

CROSS-REFERENCE TO RELATED APPLICATION

This application claims priority to and the benefit of Korean Patent Application No 10-2020-0063703, filed on May 27, 2020, the entire content of which is hereby incorporated by reference.

BACKGROUND

1. Field

Aspects of some example embodiments of the present disclosure herein relate to an electronic device.

2. Description of the Related Art

An electronic device may sense an external input applied from the outside (e.g., from an external object such as a user's finger, a stylus, and the like). The external input may be a user input. The user input includes various forms of external inputs such as a part of a user's body, light, heat, a pen, or pressure. The electronic device may recognize the coordinates of a pen using an electromagnetic resonance (EMR) method, or may recognize the coordinates of a pen using an active electrostatic (AES) method.

The above information disclosed in this Background section is only for enhancement of understanding of the background and therefore the information discussed in this Background section does not necessarily constitute prior art.

SUMMARY

Aspects of some example embodiments of the present disclosure include an electronic device which may be capable of sensing an input for an active pen.

According to some example embodiments of the inventive concept, an electronic device includes: a display layer and a sensor layer on the display layer and the sensor layer including a first sensing electrode having a first sub-sensing electrode and a second sub-sensing electrode electrically separated from the first sub-sensing electrode and a second sensing electrode intersecting the first sensing electrode, wherein the sensor layer may sense an external input through a change in mutual capacitance between the first sensing electrode and the second sensing electrode and the sensor layer sense an input by an active pen through a change in capacitance of each of the first sub-sensing electrode, the second sub-sensing electrode, and the second sensing electrode.

According to some example embodiments, each of the first sub-sensing electrode and the second sub-sensing electrode may be extended along a first direction, the second sensing electrode may be extended along a second direction intersecting the first direction, the first sub-sensing electrode and the second sub-sensing electrode are spaced apart along the second direction, and each of the first sub-sensing electrode and the second sub-sensing electrode may intersect the second sensing electrode.

According to some example embodiments, each of the first sub-sensing electrode and the second sub-sensing electrode may be extended along a first direction, the second sensing electrode may be extended along a second direction intersecting the first direction, the first sub-sensing electrode and the second sub-sensing electrode may be spaced apart along the first direction, the first sub-sensing electrode may intersect the second sensing electrode, and the second sub-sensing electrode may be spaced apart from the second sensing electrode.

According to some example embodiments, a first opening and a second opening spaced apart from the first opening may be defined in the first sub-sensing electrode, and the second sub-sensing electrode may include a first sub-sensing pattern in the first opening and electrically insulated from the first sub-sensing electrode, a second sub-sensing pattern in the second opening and electrically insulated from the first sub-sensing electrode, and a sub-bridge pattern connecting the first sub-sensing pattern and the second sub-sensing pattern.

According to some example embodiments, a length of the first sub-sensing electrode may be equal to or greater than a length of the second sub-sensing electrode.

According to some example embodiments, the second sensing electrode may include a third sub-sensing electrode and a fourth sub-sensing electrode.

According to some example embodiments, each of the first sub-sensing electrode and the second sub-sensing electrode may be extended along a first direction, each of the third sub-sensing electrode and the fourth sub-sensing electrode may be extended along a second direction intersecting the first direction, and each of the first sub-sensing electrode and the second sub-sensing electrode may intersect the third sub-sensing electrode and the fourth sub-sensing electrode.

According to some example embodiments, each of the first sub-sensing electrode and the second sub-sensing electrode may be extended along a first direction, the first sub-sensing electrode and the second sub-sensing electrode may be spaced apart along the first direction, each of the third sub-sensing electrode and the fourth sub-sensing electrode may be extended along a second direction intersecting the first direction, the third sub-sensing electrode and the fourth sub-sensing electrode may be spaced apart along the second direction, the first sub-sensing electrode and the third sub-sensing electrode may intersect each other, and the second sub-sensing electrode may be spaced apart from the third sub-sensing electrode and the fourth sub-sensing electrode.

According to some example embodiments, a sensor driving circuit for driving the sensor layer may be further included, wherein the sensor driving circuit may simultaneously provide the same signal to the first sub-sensing electrode and the second sub-sensing electrode to sense the external input and sum a sensing signal received from the third sub-sensing electrode and a sensing signal received from the fourth sub-sensing electrode, and the sensor driving circuit may receive sensing signals from the first sub-sensing electrode, the second sub-sensing electrode, the third sub-sensing electrode, and the fourth sub-sensing electrode, respectively, to sense an input by the active pen.

According to some example embodiments, the display layer may include a base layer, a circuit layer on the base layer, a light emitting element layer on the circuit layer and the light emitting element layer including a first electrode, an emission layer on the first electrode, and a second electrode on the emission layer, and an encapsulation layer on the light emitting element layer, wherein the sensor layer may be directly on the encapsulation layer.

According to some example embodiments, a sensing region in which the first sensing electrode and the second sensing electrode are and a peripheral region adjacent to the sensing region may be defined in the sensor layer, and the sensor layer may further include a first sensing line electrically connected to the first sub-sensing electrode, a second sensing line electrically connected to the second sub-sensing electrode, and a third sensing line electrically connected to the second sensing electrode, wherein each of the first sensing line, the second sensing line, and the third sensing line may be in the peripheral region.

According to some example embodiments, each of the first sub-sensing electrode and the second sub-sensing electrode may be extended along a first direction, and a width of the sensing region in the first direction may be equal to or greater than a length of the first sub-sensing electrode in the first direction.

According to some example embodiments, each of the first sub-sensing electrode and the second sub-sensing electrode may be extended along a first direction, and a width of the sensing region in the first direction may be equal to or greater than a sum of the length of the first sub-sensing electrode in the first direction and a length of the second sub-sensing electrode in the first direction.

According to some example embodiments of the inventive concept, an electronic device includes: a base layer, a circuit layer on the base layer, a light emitting element layer on the circuit layer, and a sensor layer on the display layer, having a sensing region and a peripheral region, and the sensor layer including a first sensing electrode in the sensing region and having a first sub-sensing electrode and a second sub-sensing electrode, a second sensing electrode in the sensing region and intersecting the first sensing electrode, a first sensing line electrically connected to the first sub-sensing electrode and in the peripheral region, a second sensing line electrically connected to the second sub-sensing electrode and in the peripheral region, and a third sensing line electrically connected to the second sensing electrode and in the peripheral region, wherein the sensor layer may sense an external input through a change in mutual capacitance between the first sensing electrode and the second sensing electrode and sense an input by an active pen through a change in capacitance of each of the first sub-sensing electrode, the second sub-sensing electrode, and the second sensing electrode.

According to some example embodiments, each of the first sub-sensing electrode and the second sub-sensing electrode may be extended along a first direction, the second sensing electrode may be extended along a second direction intersecting the first direction, the first sub-sensing electrode and the second sub-sensing electrode are spaced apart along the second direction, and each of the first sub-sensing electrode and the second sub-sensing electrode may intersect the second sensing electrode.

According to some example embodiments, each of the first sub-sensing electrode and the second sub-sensing electrode may be extended along a first direction, the second sensing electrode may be extended along a second direction intersecting the first direction, the first sub-sensing electrode and the second sub-sensing electrode may be spaced apart along the first direction, the first sub-sensing electrode may intersect the second sensing electrode, and the second sub-sensing electrode may be spaced apart from the second sensing electrode.

According to some example embodiments, a width of the sensing region in the first direction may be equal to or greater than a sum of a length of the first sub-sensing electrode in the first direction and a length of the second sub-sensing electrode in the first direction.

According to some example embodiments, a length of the first sub-sensing electrode in the first direction may be equal to or greater than a length of the second sub-sensing electrode in the first direction.

According to some example embodiments, a first opening and a second opening spaced apart from the first opening are defined in the first sub-sensing electrode, and the second sub-sensing electrode may include a first sub-sensing pattern in the first opening and electrically insulated from the first sub-sensing electrode, a second sub-sensing pattern in the second opening and electrically insulated from the first sub-sensing electrode, and a sub-bridge pattern connecting the first sub-sensing pattern and the second sub-sensing pattern.

According to some example embodiments, a sensor driving circuit for driving the sensor layer may be further included the second sensing electrode may include a third sub-sensing electrode and a fourth sub-sensing electrode, wherein the sensor driving circuit may simultaneously provide the same signal to the first sub-sensing electrode and the second sub-sensing electrode to sense the external input and sum a sensing signal received from the third sub-sensing electrode and a sensing signal received from the fourth sub-sensing electrode, and the sensor driving circuit may receive sensing signals from the first sub-sensing electrode, the second sub-sensing electrode, the third sub-sensing electrode, and the fourth sub-sensing electrode, respectively, to sense an input by the active pen.

BRIEF DESCRIPTION OF THE DRAWINGS

The accompanying drawings are included to provide a further understanding of the inventive concept, and are incorporated in and constitute a part of this specification. The drawings illustrate aspects of some example embodiments of the inventive concept and, together with the description, serve to explain characteristics of embodiments according to the inventive concept. In the drawings.

DETAILED DESCRIPTION

Figure 1:
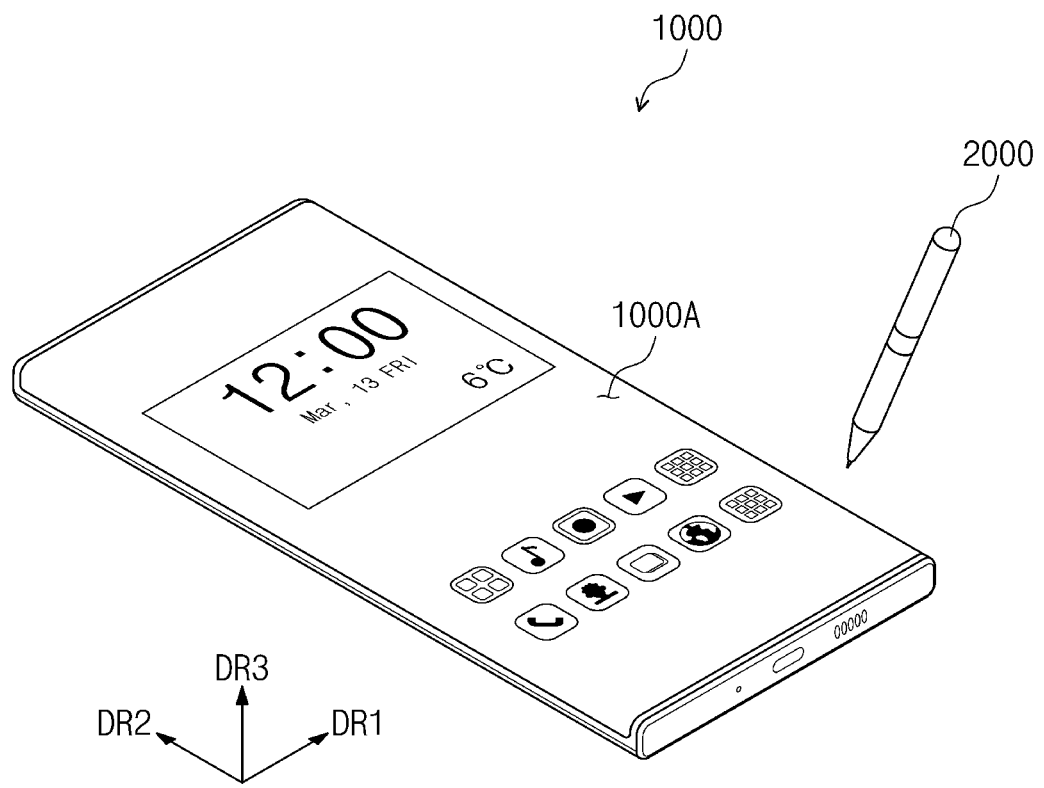
FIG. 1 is a perspective view of an electronic device according to some example embodiments of the inventive concept.

In the present disclosure, when an element (or a region, a layer, a portion, etc.) is referred to as being "on," "connected to," or "coupled to" another element, it means that the element may be directly on/located on/connected to/coupled to the other element, or that a third element may be located therebetween.

Like reference numerals refer to like elements. Also, in the drawings, the thickness, the ratio, and the dimensions of elements are exaggerated for an effective description of technical contents.

The term "and/or," includes all combinations of one or more of which associated configurations may define.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concept. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

Unless otherwise defined, all terms (including technical and scientific terms) used herein have the same meaning as commonly understood by one of ordinary skill in the art to which the inventive concept pertains. It is also to be understood that terms defined in commonly used dictionaries should be interpreted as having meanings consistent with the meanings in the context of the related art, and are expressly defined herein unless they are interpreted in an ideal or overly formal sense.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, aspects of some example embodiments of the inventive concept will be described in more detail with reference to the accompanying drawings.

FIG. 1 is a perspective view of an electronic device according to some example embodiments of the inventive concept.

Referring to FIG. 1, an electronic device 1000 may be a device activated according to an electrical signal. For example, the electronic device 1000 may be a mobile phone, a tablet computer, a car navigation system, a game machine, or a wearable device, but embodiments according to the inventive concept are not limited thereto. In FIG. 1, the electronic device 1000 is illustrated, as an example, as being a mobile phone, but embodiments according to the present disclosure are not limited thereto.

The electronic device 1000 may display an image through an active region 1000A. The active region 1000A may include a plane defined by a first direction DR1 and a second direction DR2. The thickness direction of the electronic device 1000 may be parallel to a third direction DR3 intersecting the first direction DR1 and the second direction DR2. Therefore, a front surface (or an upper surface) and a rear surface (or a lower surface) of members constituting the electronic device 1000 may be defined on the basis of the third direction DR3.

The electronic device 1000 may sense inputs applied from the outside of the electronic device 1000. The external input may be a user input. The user input may include various forms of external inputs such as a part of a users body, an active pen 2000, light, heat, a pen, or pressure.

The electronic device 1000 illustrated in FIG. 1 may sense an input by a user's touch and an input by the active pen 2000. The electronic device 1000 and the active pen 2000 may communicate in a bidirectional manner. The electronic device 1000 may provide an up-link signal to the active pen 2000. For example, the up-link signal may include a synchronization signal or information on the electronic device 1000, but embodiments according to the inventive concept are not particularly limited thereto. The active pen 2000 may provide a down-link signal to the electronic device 1000. The down-link signal may include a synchronization signal or information on the state of the active pen 2000. For example, the down-link signal may include the coordinate information of an active pen 2000, the battery information of an active pen 2000, the slope information of an active pen 2000, and/or various information stored in an active pen 2000, but the embodiments according to the inventive concept are not particularly limited thereto.

Figure 2A:
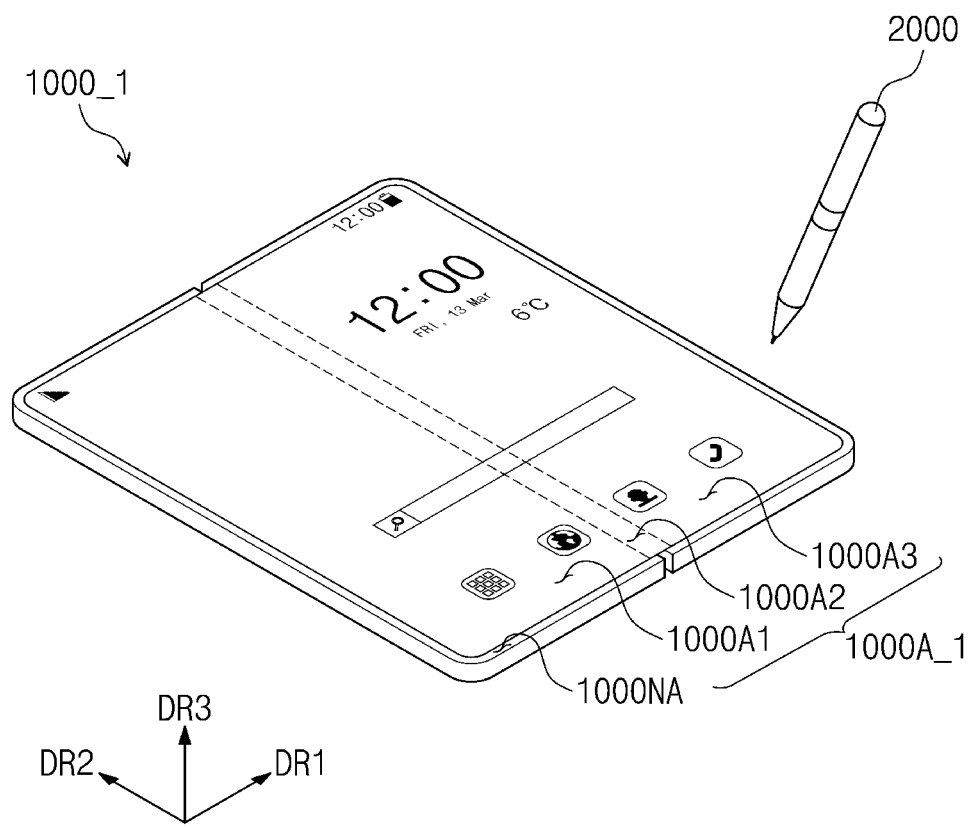
FIG. 2A and FIG. 2B are perspective views of an electronic device according to some example embodiments of the inventive concept.
Figure 2B:
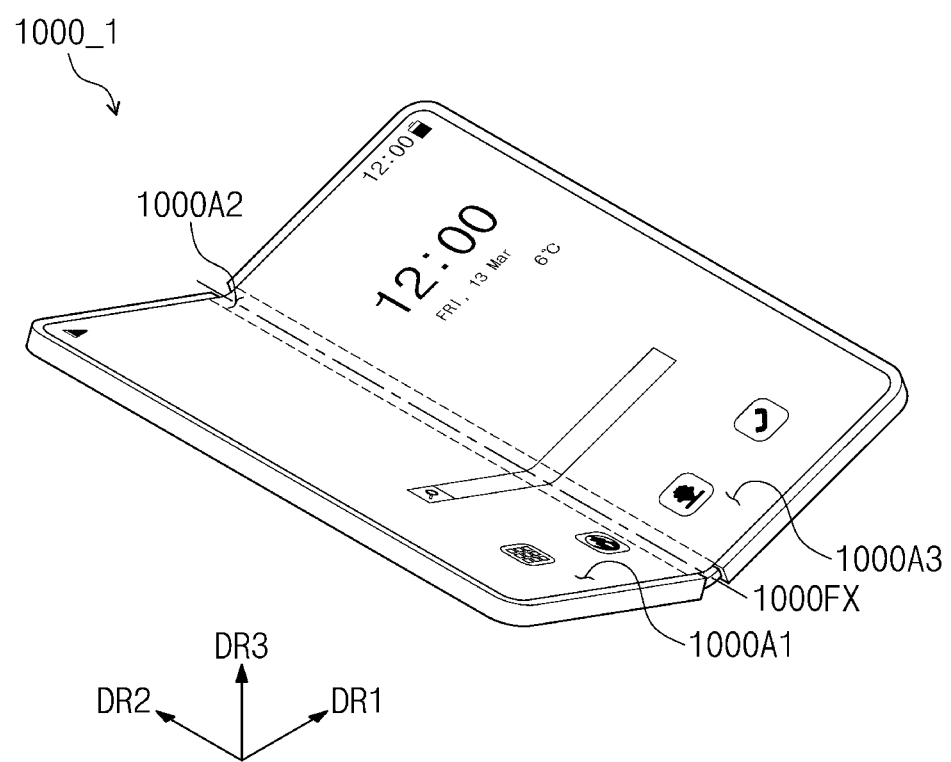

FIG. 2A and FIG. 2B are perspective views of an electronic device according to some example embodiments of the inventive concept.

Referring to FIG. 2A and FIG. 2B, an electronic device 1000_1 may display an image through an active region 1000A_1. When the electronic device 1000_1 is unfolded, the active region 1000A_1 may include a plane defined by the first direction DR1 and the second direction DR2.

The active region 1000A_1 may include a first region 1000A1, a second region 1000A2, and a third region 1000A3. The second region 1000A2 may be bent on the basis of a folding axis 1000FX extending along the second direction DR2. Therefore, the first region 1000A1 and the third region 1000A3 may be referred to as non-folding regions, and the second region 1000A2 may be referred to as a folding region.

When the electronic device 1000_1 is folded, the first region 1000A1 and the third region 1000A3 may face each other. Therefore, in a completely folded state, the active region 1000A_1 may not be exposed to the outside, which may be referred to as in-folding. However, this is only example. The operation of the electronic device 1000_1 is not limited thereto.

For example, according to some example embodiments of the inventive concept, when the electronic device 1000_1 is folded, the first region 1000A1 and the third region 1000A3 may oppose each other. Therefore, in a folded state, the active region 1000A_1 may be exposed to the outside, which may be referred to as out-folding.

The electronic device 1000_1 may perform only one operation of in-folding or an out-folding. Alternatively, the electronic device 1000_1 may perform both an in-folding operation and an out-folding operation. In this case, the same region of the electronic device 1000_1, for example, the second region 1000A2 may be in-folded and out-folded.

In FIG. 2A and FIG. 2B, one folding region and two non-folding regions are illustrated as an example. However, the number of folding regions and non-folding regions is not limited thereto, and there may be fewer or additional folding regions according to the design of the electronic device. For example, the electronic device 1000_1 may include a plurality of more than 2 non-folding regions and a plurality of folding regions located between non-folding regions adjacent to each other.

In FIG. 2A and FIG. 2B, the folding axis 1000FX is illustrated as extending in the second direction DR2, but embodiments according to the inventive concept are not limited thereto. For example, the folding axis 1000FX may extend along a direction parallel to the first direction DR1. In this case, the first region 1000A1, the second region 1000A2, and the third region 1000A3 may be sequentially arranged along the second direction DR2.

The active region 1000A_1 may overlap at least one electronic module. For example, electronic modules may include a camera module, a proximity illuminance sensor, and the like. The electronic modules may receive an external input transmitted through the active region 1000A_1, or may provide an output through the active region 1000A_1. A portion of the active region 1000A_1 overlapping the camera module, the proximity illuminance sensor, and the like may have a higher transmittance than other portions of the active region 1000A_1. Therefore, it may not be necessary to provide a region in which a plurality of electronic modules are to be located to a peripheral region 1000NA around the active region 1000A_1. As a result, the area ratio of the active region 1000A_1 to a front surface of the electronic device 1000_1 may be increased.

The electronic device 1000_1 and the active pen 2000 may communicate in a bidirectional manner. The electronic device 1000_1 may provide an up-link signal to the active pen 2000. The active pen 2000 may provide a down-link signal to the electronic device 1000_1. The electronic device 1000_1 may sense the coordinates of the active pen 2000 using a signal provided from the active pen 2000.

Figure 3:
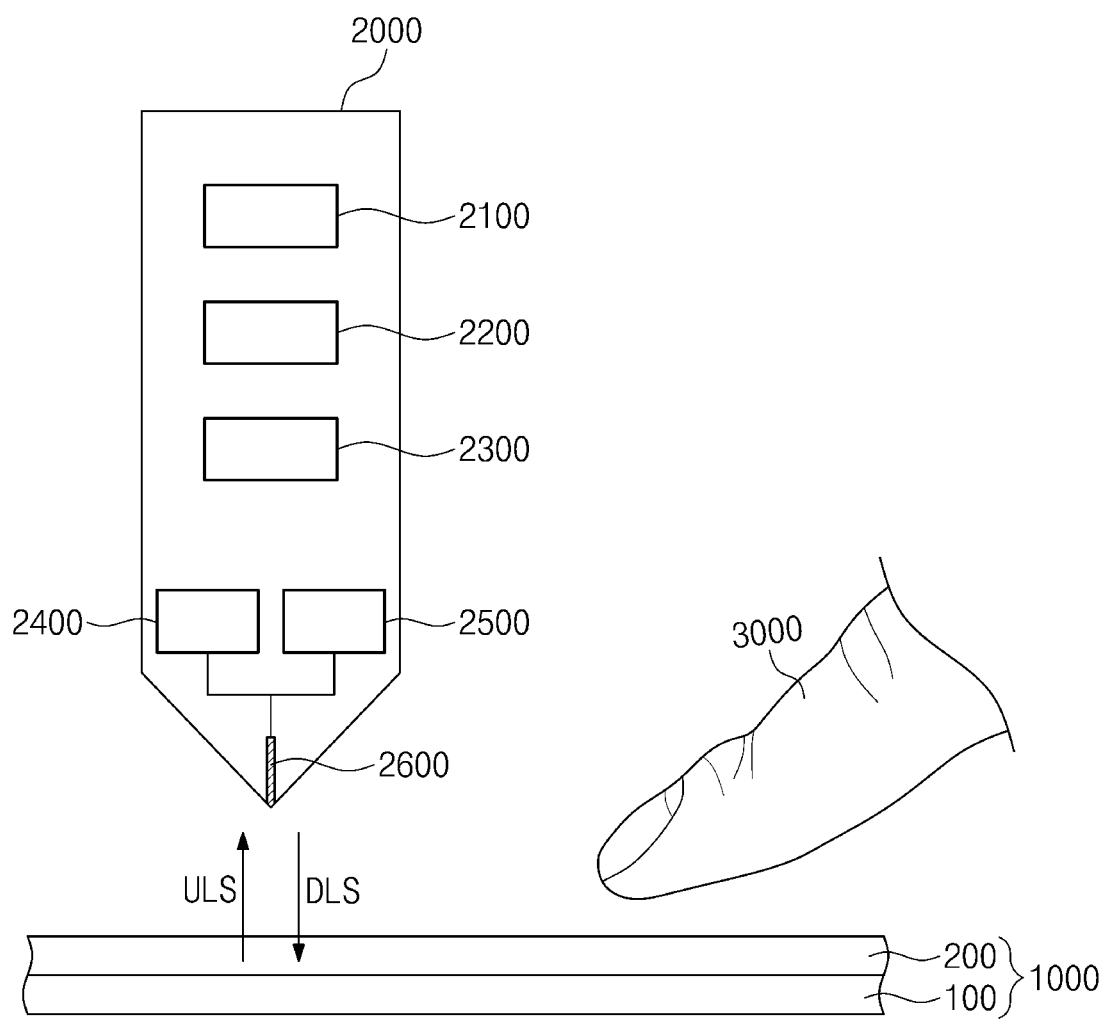
FIG. 3 is a block diagram schematically illustrating an electronic device and an active pen according to some example embodiments of the inventive concept.

FIG. 3 is a block diagram schematically illustrating an electronic device and an active pen according to some example embodiments of the inventive concept.

Referring to FIG. 3, the electronic device 1000 may include a display layer 100 and a sensor layer 200.

The display layer 100 may be a component for substantially generating an image. The display layer 100 may be a light-emitting type display layer. For example, the display layer 100 may be an organic light emitting display layer, a quantum-dot display layer, a micro-LED display layer, or a nano-LED display layer.

The sensor layer 200 may be located on the display layer 100. The sensor layer 200 may sense an external input applied from the outside. The sensor layer 200 may sense both an input by a users body 3000 and an input by the active pen 2000.

The sensor layer 200 may be operated by time division driving. For example, the sensor layer 200 may be alternately driven in the first mode and the second mode. The first mode may be a mode for sensing an input by the users body 3000, and the second mode may be a mode for sensing an input by the active pen 2000.

When the second mode is started, the sensor layer 200 may provide an up-link signal ULS to the active pen 2000. When the active pen 2000 receives the up-link signal ULS to be synchronized with the electronic device 1000, the active pen 2000 may provide a down-link signal DLS toward the sensor layer 200.

The active pen 2000 may include a power 2100, a memory 2200, a controller 2300, a transmitter 2400, a receiver 2500, and a pen tip 2600. However, components constituting the active pen 2000 are not limited to the components listed above. For example, the active pen 2000 may further include an electrode switch for switching the pen tip 2600 to a signal transmission mode or a signal reception mode, a pressure sensor for sensing pressure, a rotation sensor for sensing rotation, or the like.

The power 2100 may include a battery for supplying power to the active pen 2000. The memory 2200 may store function information of the active pen 2000. The controller 2300 may control the operation of the active pen 2000. Each of the transmitter 2400 and the receiver 2500 may communication with the electronic device 1000 through the pen tip 2600. The transmitter 2400 may be referred to as a signal generator or a transmission circuit, and the receiver 2500 may be referred to as a signal receiver or a reception circuit.

Figure 4:
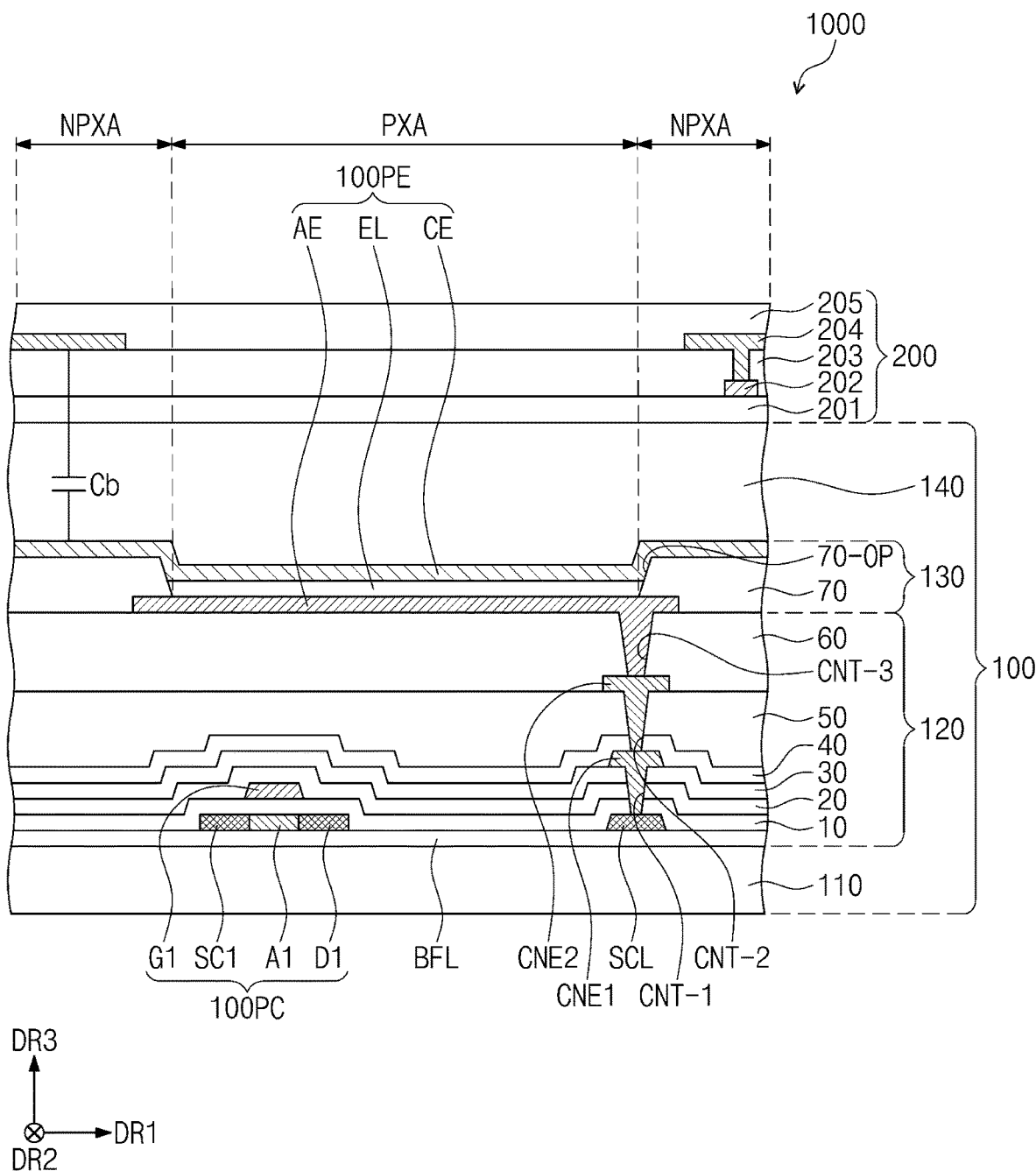
FIG. 4 is a cross-sectional view of an electronic device according to some example embodiments of the inventive concept.

FIG. 4 is a cross-sectional view of an electronic device according to some example embodiments of the inventive concept.

Referring to FIG. 4, the display layer 100 may include a base layer 110, a circuit layer 120, a light emitting element layer 130, and an encapsulation layer 140.

The base layer 110 may be a member which provides a base surface on which the circuit layer 120 is located. The base layer 110 may be a glass substrate, a metal substrate, a plastic substrate, or the like. However, the embodiments according to the inventive concept are not limited thereto, and the base layer 110 may be an inorganic layer, an organic layer, or a composite material layer.

The base layer 110 may have a multi-layered structure. For example, the base layer 110 may have a three-layered structure of a synthetic resin layer, an adhesive layer, and a synthetic resin layer. Particularly, the synthetic resin layer may include a polyimide-based resin. In addition, the synthetic resin layer may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, or a perylene-based resin. Meanwhile, in the present disclosure, "~~"-based resin means that a functional group of "~~" is included.

The circuit layer 120 may be located on the base layer 110. The circuit layer 120 may include an insulation layer, a semiconductor pattern, a conductive pattern, a signal line, and the like. The insulation layer, a semiconductor layer, and a conductive layer are formed on the base layer 110 by coating, deposition, and the like, and thereafter, the insulation layer, the semiconductor layer, and the conductive layer may be selectively patterned through performing a photolithography process a plurality of times. Thereafter, the semiconductor pattern, the conductive pattern, and the signal line, all included in the circuit layer 120, may be formed.

At least one inorganic layer is formed on an upper surface of the base layer 110. The inorganic layer may include at least one of aluminum oxide, titanium oxide, silicon oxide, silicon oxynitride, zirconium oxide, or hafnium oxide. The inorganic layer may be formed as a multi-layered inorganic layer. The multi-layered inorganic layers may constitute the barrier layer and/or the buffer layer. According to some example embodiments, the display layer 100 is illustrated as including a buffer layer BFL.

The buffer layer BFL may improve the bonding force between the base layer 110 and the semiconductor pattern. The buffer layer BFL may include a silicon oxide layer and a silicon nitride layer, and the silicon oxide layer and the silicon nitride layer may be alternately stacked.

The semiconductor pattern may be located on the buffer layer BFL. The semiconductor pattern may include polysilicon. However, the embodiments according to the inventive concept are not limited thereto, and the semiconductor pattern may include amorphous silicon, or oxide semiconductor.

FIG. 4 only illustrates a portion of the semiconductor pattern, and the semiconductor pattern may be further located in another region. The semiconductor pattern may be arranged across pixels according to a specific rule. The semiconductor pattern may have different electrical properties depending on whether or not the semiconductor pattern is doped. The semiconductor pattern may include a first region having high conductivity and a second region having low conductivity. The first region may be doped with an N-type dopant or a P-type dopant. A P-type transistor may include a doped region which has been doped with the P-type dopant, and an N-type transistor may include a doped region which has been doped with the N-type dopant. The second region may be a non-doped region or a region doped with a lower concentration than the first region.

The first region is more conductive than the second region, and may substantially serve as an electrode or a signal line. The second region may substantially correspond to an active (or a channel) of a transistor. In other words, a portion of the semiconductor pattern may be the active of the transistor, another portion thereof may be a source or a drain of the transistor, and the other portion thereof may be a connection electrode or a connection signal line.

Each of the pixels may have an equivalent circuit including seven transistors, one capacitor, and a light emitting element, and the equivalent circuit diagram of a pixel may be modified in various forms. FIG. 4 illustrates an example of one transistor 100PC and a light emitting element 100PE included in a pixel.

A source SC1, an active A1, and a drain D1 of the transistor 100PC may be formed from the semiconductor pattern. The source SC1 and the drain D1 may be extended in opposite directions from the active A1 on a cross section. FIG. 4 illustrates a portion of a connection signal line SCL formed from the semiconductor pattern. Although not separately illustrated, the connection signal line SCL may be electrically connected to the drain D1 of the transistor 100PC on a plane.

A first insulation layer 10 may be located on the buffer layer BFL. The first insulation layer 10 commonly overlaps a plurality of pixels, and may cover the semiconductor pattern. The first insulation layer 10 may be an inorganic layer and/or an organic layer, and may have a single-layered structure or a multi-layered structure. The first insulation layer 10 may include at least one of aluminum oxide, titanium oxide, silicon oxide, silicon oxynitride, zirconium oxide, or hafnium oxide. According to some example embodiments, the first insulation layer 10 may be a silicon oxide layer of a single layer. Not only the first insulation layer 10 but also an insulation layer of the circuit layer 120 to be described may be an inorganic layer and/or an organic layer, and may have a single-layered structure or a multi-layered structure. The inorganic layer may include at least one of the above-described materials, but the embodiments according to the inventive concept are not limited thereto.

A gate G1 of the transistor 100PC is located on the first insulation layer 10. The gate G1 may be a portion of a metal pattern. The gate G1 overlaps the active A1. In a process of doping the semiconductor pattern, the gate G1 may function as a mask.

A second insulation layer 20 is located on the first insulation layer 10, and may cover the gate G1. The second insulation layer 20 may commonly overlap pixels. The second insulation layer 20 may be an inorganic layer and/or an organic layer, and may have a single-layered structure or a multi-layered structure. According to some example embodiments, the second insulation layer 20 may be a silicon oxide layer of a single layer.

A third insulation layer 30 may be located on the second insulation layer 20, and according to some example embodiments, the third insulation layer 30 may be a silicon oxide layer of a single layer.

A first connection electrode CNE1 may be located on the third insulation layer 30. The first connection electrode CNE1 may be connected to the connection signal line SCL through a contact hole CNT-1 passing through the first to third insulation layers 10, 20, and 30.

A fourth insulation layer 40 may be located on the third insulation layer 30. The fourth insulation layer 40 may be a silicon oxide layer of a single layer. A fifth insulation layer 50 may be located on the fourth insulation layer 40. The fifth insulation layer 50 may be an organic layer.

A second connection electrode CNE2 may be located on the fifth insulation layer 50. The second connection electrode CNE2 may be connected to the first connection electrode CNE1 through a contact hole CNT-2 passing through the fourth insulation layer 40 and the fifth insulation layer 50.

A sixth insulation layer 60 is located on the fifth insulation layer 50, and may cover the second connection electrode CNE2. The sixth insulation layer 60 may be an organic layer. The light emitting element layer 130 may be located on the circuit layer 120. The light emitting element layer 130 may include a light emitting element. For example, the light emitting element layer 130 may include an organic light emitting material, a quantum dot, a quantum rod, a micro LED, or a nano LED. A light emitting element 100PE may include a first electrode AE, a emission layer EL, and a second electrode CE.

The first electrode AE may be located on the sixth insulation layer 60. The first electrode AE may be connected to the second connection electrode CNE2 through a contact hole CNT-3 passing through the sixth insulation layer 60.

A pixel definition film 70 is located on the sixth insulation layer 60, and may cover a portion of the first electrode AE. In the pixel definition film 70, an opening 70-OP is defined. The opening 70-OP of the pixel definition film 70 exposes at least a portion of the first electrode AE. According to some example embodiments, a light emitting region PXA is defined to correspond to some regions of the first electrode AE exposed by the opening 70-OP. A non-light emitting region NPXA may surround the light emitting region PXA.

The emission layer EL may be located on the first electrode AE. The emission layer EL may be located in the opening 70-OP. That is, the emission layer EL may be divided and formed in each of the pixels. When the emission layer EL is divided and formed in each of the pixels, each of the emission layers EL may emit light of at least one color of blue, red, or green. However, the embodiments according to the inventive concept are not limited thereto, and the emission layer EL may be connected to the pixels and commonly provided. In this case, the emission layer EL may provide blue light or white light.

The second electrode CE may be located on the emission layer EL. The second electrode CE has an integral shape, and may be commonly utilized by the plurality of pixels. The second electrode CE may be provided with a common voltage, and the second electrode CE may be referred as a common electrode.

According to some example embodiments, a hole control layer may be located between the first electrode AE and the emission layer EL. The hole control layer may be commonly located in the light emitting region PXA and the non-light emitting region NPXA. The hole control layer includes a hole transport layer, and may further include a hole injection layer. An electron control layer may be located between the emission layer EL and the second electrode CE. The electron control layer includes an electron transport layer, and may further include an electron injection layer. The hole control layer and the electron control layer may be commonly formed in the plurality of pixels using an open mask. The encapsulation layer 140 may be located on the light emitting element layer 130. The encapsulation layer 140 may include an inorganic layer, an organic layer, and an inorganic layer sequentially stacked, but layers constituting the encapsulation layer 140 are not limited thereto.

The inorganic layers may protect the light emitting element layer 130 from moisture and oxygen, and the organic layer may protect the light emitting element layer 130 from foreign materials such as dust particles. The inorganic layers may include a silicon nitride layer, a silicon oxynitride layer, a silicon oxide layer, a titanium oxide layer, an aluminum oxide layer, or the like. The organic layer may include an acrylic organic layer, but the embodiments of the inventive concept are not limited thereto.

The sensor layer 200 may be formed on the display layer 100 through a series of processes. In this case, the sensor layer 200 may be expressed as being directly located on the display layer 100. Being directly located may mean that a third component is not located between the sensor layer 200 and the display layer 100. That is, a separate adhesive member may not be located between the sensor layer 200 and the display layer 100. In this case, the electronic device 1000 may become thinner. In addition, as the display layer 100 and the sensor layer 200 become thinner, the flexibility thereof improves, the display layer 100 and the sensor layer 200 may be applied to a foldable electronic device 10001 (see, e.g., FIG. 2A).

The sensor layer 200 may include a base layer 201, a first conductive layer 202, a sensing insulation layer 203, a second conductive layer 204, and a cover insulation layer 205.

The base layer 201 may be an inorganic layer including any one of silicon nitride, silicon oxynitride, and silicon oxide. Alternatively, the base layer 201 may be an organic layer including an epoxy resin, an acrylic resin, or an imide-based resin. The base layer 201 may have a single-layered structure, or a multi-layered structure in which layers are stacked along the third direction DR3.

Each of the first conductive layer 202 and the second conductive layer 204 may have a single-layered structure, or a multi-layered structure in which layers are stacked along the third direction DR3.

A conductive layer of a single-layered structure may include a metal layer or a transparent conductive layer. The metal layer may include molybdenum, silver, titanium, copper, aluminum, or an alloy thereof. The transparent conductive layer may include a transparent conductive oxide such as indium tin oxide (ITO), indium zinc oxide (IZO), zinc oxide (ZnO), indium tin zinc oxide (ITZO), or the like. In addition, the transparent conductive layer may include a conductive polymer such as PEDOT, a metal nanowire, graphene, and the like.

A conductive layer of a multi-layered structure may include metal layers. The metal layers may have, for example, a three-layered structure of titanium/aluminum/titanium. The conductive layer of a multi-layered structure may include at least one metal layer and at least one transparent conductive layer.

At least one of the sensing insulation layer 203 or the cover insulation layer 205 may include an inorganic film. The inorganic film may include at least one of aluminum oxide, titanium oxide, silicon oxide, silicon oxynitride, zirconium oxide, or hafnium oxide.

At least one of the sensing insulation layer 203 or the cover insulation layer 205 may include an organic film. The organic film may include at least any one among an acrylic resin, a methacrylic resin, polyisoprene, a vinyl-based resin, an epoxy-based resin, a urethane-based resin, a cellulose-based resin, a siloxane-based resin, a polyimide-based resin, a polyamide-based resin, and a perylene-based resin.

Parasitic capacitance Cb may be generated between the sensor layer 200 and the second electrode CE. The parasitic capacitance Cb may be referred to as base capacitance. The value of the parasitic capacitance Cb may be increased as the sensor layer 200 and the second electrode CE become closer to each other. As the parasitic capacitance Cb increases, the ratio of the amount of change in capacitance to a reference value may decrease. The amount of change in capacitance means the change in capacitance generating before and after an input by an input means, for example, the active pen 2000 (see, e.g., FIG. 3) or the user's body 3000 (e.g., a user's finger or other body part) (see, e.g., FIG. 3).

A driving chip for processing a signal sensed from the sensor layer 200 may perform a leveling operation for eliminating a value corresponding to the parasitic capacitance Cb from the sensed signal. By the leveling operation, the ratio of the amount of change in capacitance to a reference value is increased, so that sensing sensitivity may be improved.

However, depending on the specifications of the drive chip, there may be a difference in the ability to eliminate the value corresponding to the parasitic capacitance Cb. For example, if a maximum parasitic capacitance Cb is 500 picofarads, and a capacitance value which the driving chip may eliminate from a signal sensed by the sensor layer 200 is 200 picofarads, a reference value may not sufficiently lowered by the driving chip. In this case, because the ratio of the amount of change in capacitance to the reference value is insignificant, the driving chip may recognize the amount of change in capacitance as a noise or may not recognize, so that a malfunction in which touch coordinates are not sensed may occur. According to some example embodiments of the inventive concept, by modifying the electrode structure of the sensor layer 200, a maximum value of the parasitic capacitance Cb may be provided below a value (e.g., a set or predetermined value). In this case, even in the case in which the performance of the driving chip is relatively low, the accuracy of coordinate recognition may be improved. The value (e.g., the set or predetermined value) may be 200 picofarads, but embodiments according to the present disclosure are not particularly limited thereto.

Figure 5:
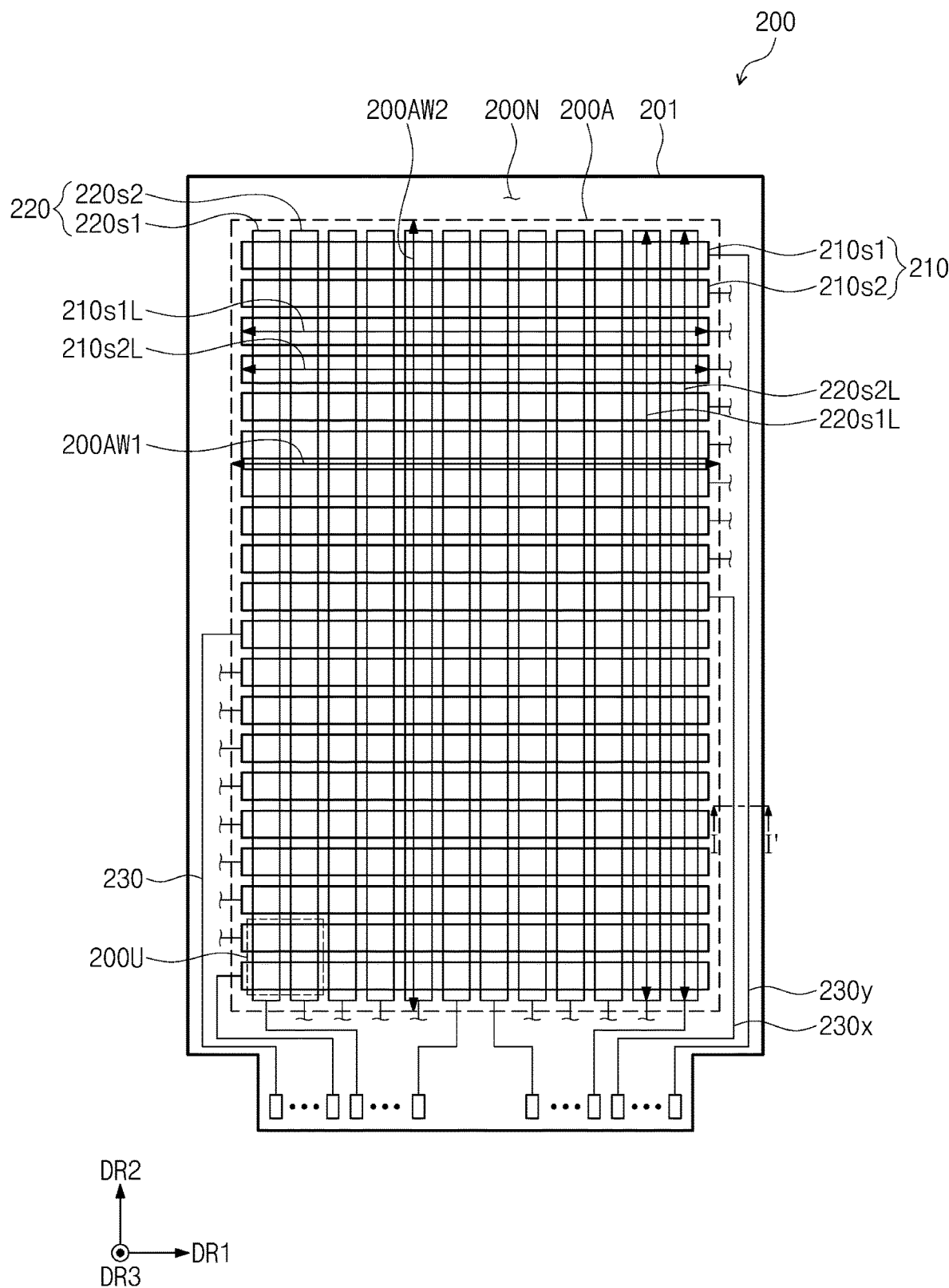
FIG. 5 is a plan view illustrating a sensor layer according to some example embodiments of the inventive concept.

FIG. 5 is a plan view illustrating a sensor layer according to some example embodiments of the inventive concept.

Referring to FIG. 5, the sensor layer 200 may include a sensing region 200A and a peripheral region 200N. The sensing region 200A may be a region activated by an electrical signal. For example, the sensing region 200A may be a region which senses an input. The peripheral region 200N may surround the sensing region 200A.

The sensor layer 200 may include a plurality of first sensing electrodes 210 (hereinafter, first sensing electrodes), a plurality of second sensing electrodes 220 (hereinafter, second sensing electrodes), and a plurality of sensing lines 230. The first sensing electrodes 210 and the second sensing electrodes 220 may be located in the sensing region 200A. The sensing lines 230 may be located in the peripheral region 200N.

The sensor layer 200 may be operated in a first mode in which information on an external input is obtained through the change in mutual capacitance between the first sensing electrodes 210 and the second sensing electrodes 220, or in a second mode in which an input by the active pen 2000 (see, e.g., FIG. 3) is sensed through the change in capacitance of each of the first sensing electrodes 210 and the second sensing electrodes 220.

Each of the first sensing electrodes 210 may be extended in the first direction DR1. The first sensing electrodes 210 may be spaced apart and arranged in the second direction DR2. Each of the second sensing electrodes 220 may be extended in the second direction DR2. The second sensing electrodes 220 may be spaced apart and arranged in the first direction DR1. The first sensing electrodes 210 and the second sensing electrodes 220 may intersect each other.

Each of the first sensing electrodes 210 may include a first sub-sensing electrode 210s1 and a second sub-sensing electrode 210s2. Each of the second sensing electrodes 220 may include a third sub-sensing electrode 220s1 and a fourth sub-sensing electrode 220s2.

The first sub-sensing electrode 210s1 and the second sub-sensing electrode 210s2 may be electrically separated in the sensor layer 200, and the third sub-sensing electrode 220s1 and the fourth sub-sensing electrode 220s2 may be electrically separated in the sensor layer 200. Therefore, the maximum parasitic capacitance generated in the sensor layer 200 may be reduced.

The maximum parasitic capacitance may be generated between opposing electrodes in the sensor layer 200 and the second electrode CE (see, e.g., FIG. 4). The opposing electrode may be a conductive pattern having the largest area among the components in the sensor layer 200. For example, the opposing electrode may be one sensing line 230 electrically connected to one first sub-sensing electrode 210s1 and one first sub-sensing electrode 210s1, or one sensing line 230 electrically connected to one third sub-sensing electrode 220s1 and one third sub-sensing electrode 220s1.

Each of the first sub-sensing electrode 210s1 and the second sub-sensing electrode 210s2 may be extended along the first direction DR1. The first sub-sensing electrode 210s1 and the second sub-sensing electrode 210s2 may be spaced apart along the second direction DR2 intersecting the first direction DR1.

Each of the third sub-sensing electrode 220s1 and the fourth sub-sensing electrode 220s2 may be extended along the second direction DR2. The third sub-sensing electrode 220s1 and the fourth sub-sensing electrode 220s2 may be spaced apart along the first direction DR1.

Each of the first sub-sensing electrode 210s1 and the second sub-sensing electrode 210s2 may intersect the second sensing electrode 220. Each of the first sub-sensing electrode 210s1 and the second sub-sensing electrode 210s2 may intersect both the third sub-sensing electrode 220s1 and the fourth sub-sensing electrode 220s2.

A length 210s1L of the first sub-sensing electrode 210s1 in the first direction DR1 and a length 210s2L of the second sub-sensing electrode 210s2 in the first direction DR1 may be substantially the same. In addition, a width 200AW1 of the sensing region 200A in the first direction DR1 may be equal to or greater than each of the length 210s1L of the first sub-sensing electrode 210s1 in the first direction DR1 and the length 210s2L of the second sub-sensing electrode 210s2 in the first direction DR1.

A length 220s1L of the third sub-sensing electrode 220s1 in the second direction DR2 and a length 220s2L of the fourth sub-sensing electrode 220s2 in the second direction DR2 may be substantially the same. In addition, a width 200AW2 of the sensing region 200A in the second direction DR2 may be equal to or greater than each of the length 220s1L of the third sub-sensing electrode 220s1 in the second direction DR2 and the length 220s2L of the fourth sub-sensing electrode 220s2 in the second direction DR2.

Figure 6:
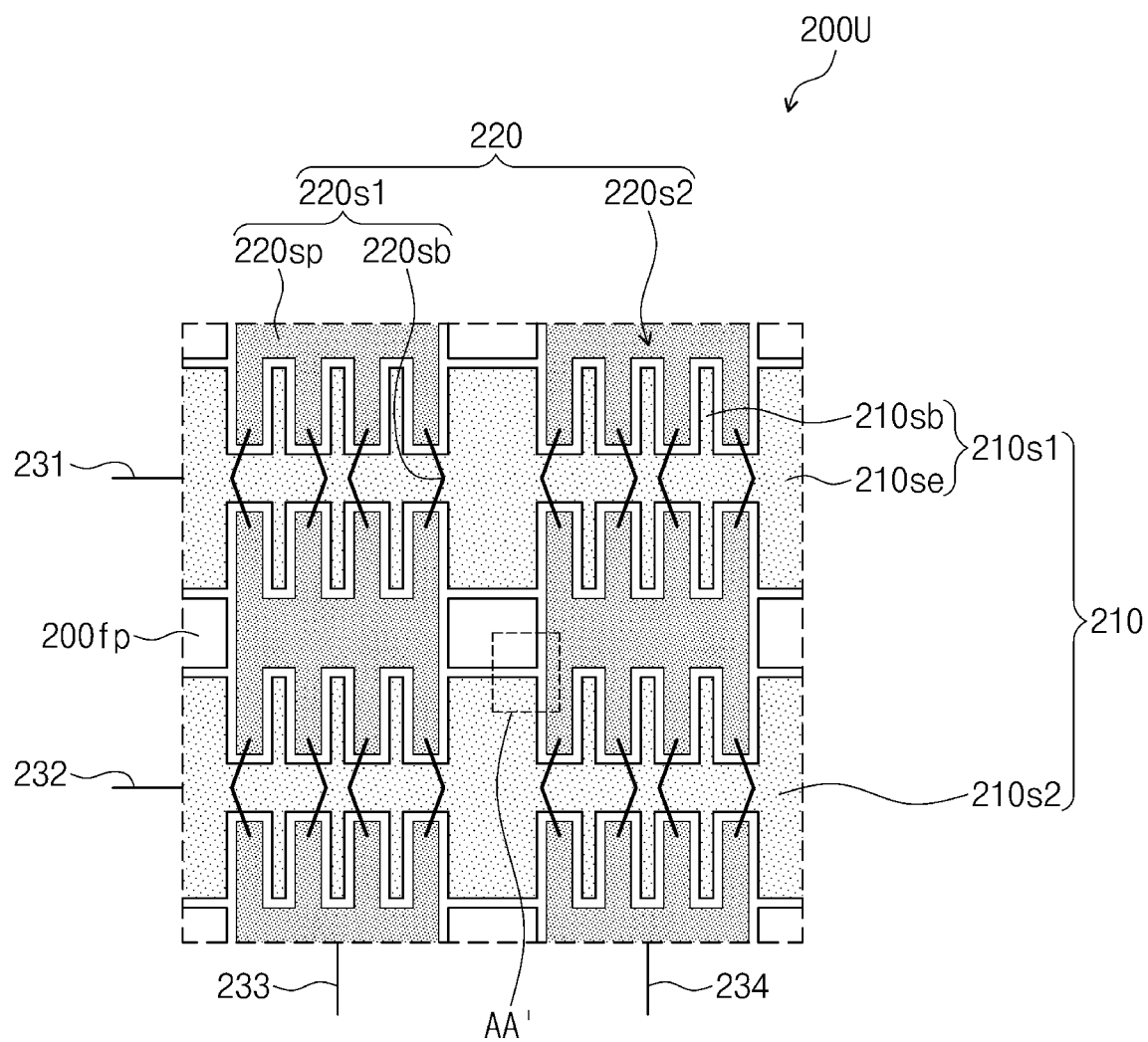
FIG. 6 is a plan view illustrating an enlarged view of a portion of the sensor layer illustrated in FIG. 5 according to some example embodiments.
Figure 7:
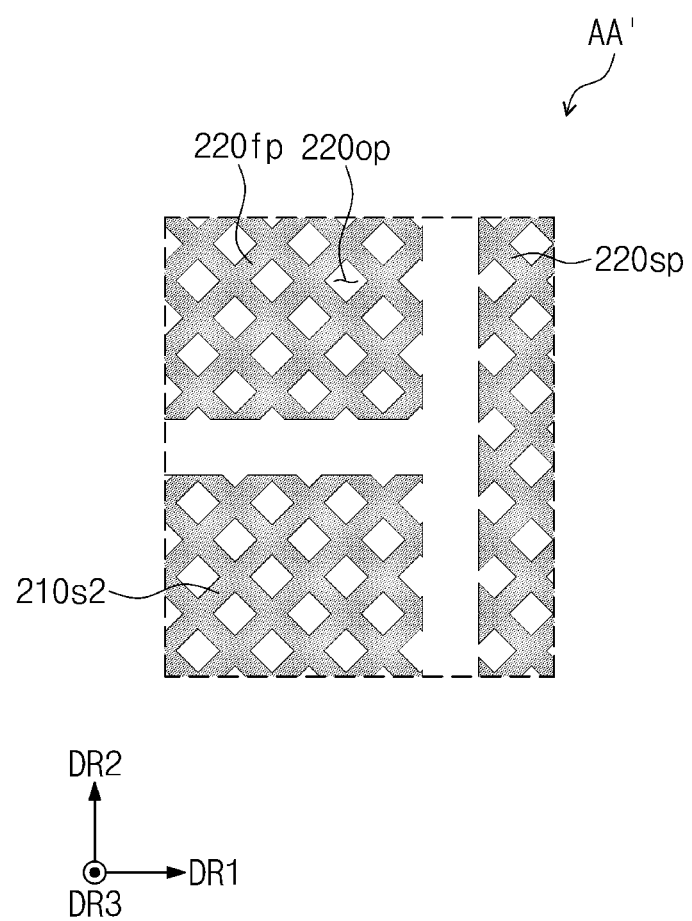
FIG. 7 is a plan view illustrating an enlarged view of a portion of the sensor layer illustrated in FIG. 6 according to some example embodiments.

FIG. 6 is a plan view illustrating an enlarged view of a portion of the sensor layer illustrated in FIG. 5. FIG. 7 is a plan view illustrating an enlarged view of a portion of the sensor layer illustrated in FIG. 6.

Referring to FIG. 5, FIG. 6, and FIG. 7, a portion of one first sensing electrode 210 and a portion of one second sensing electrode 220 may be defined as one sensing unit 200U. One sensing unit 200U may include all of the first sub-sensing electrode 210s1, the second sub-sensing electrode 210s2, the third sub-sensing electrode 220s1, and the fourth sub-sensing electrode 220s2.

The sensing lines 230 may include a first sensing line 231 connected to the first sub-sensing electrode 210s1, a second sensing line 232 connected to the second sub-sensing electrode 210s2, a third sensing line 233 connected to the third sub-sensing electrode 220s1, and a fourth sensing line 234 connected to the fourth sub-sensing electrode 220s2.

Because the first to fourth sub-sensing electrodes 210s1, 210s2, 220s1, and 220s2 located in one sensing unit 200U is electrically connected to the first to fourth sensing lines 231, 232, 233, and 234, respectively, the first to fourth sub-sensing electrodes 210s1, 210s2, 220s1, and 220s2 may be electrically separated from each other.

Each of the first sub-sensing electrode 210s1 and the second sub-sensing electrode 210s2 may include an extension portion 210se extending along the first direction DR1 and a plurality of branch portions 210sb protruding along the second direction DR2 from the extension portion 210se.

Each of the third sub-sensing electrode 220s1 and the fourth sub-sensing electrode 220s2 may include a plurality of sensing patterns 220sp (hereinafter, sensing patterns) and a plurality of bridge patterns 220sb (hereinafter, bridge patterns).

The sensing patterns 220sp do not overlap the first sub-sensing electrode 210s1 and the second sub-sensing electrode 210s2 and may be spaced apart from the first sub-sensing electrode 210s1 and the second sub-sensing electrode 210s2. Each of the sensing patterns 220sp may have a shape interlocking with the plurality of branch portions 210sb.

The bridge patterns 220sb may be electrically connected to two sensing patterns 220sp spaced apart having either the first sub-sensing electrode 210s1 or the second sub-sensing electrode 210s2 interposed therebetween. When viewed in the third direction DR3, the bridge patterns 220sb may overlap either the first sub-sensing electrode 210s1 or the second sub-sensing electrode 210s2.

In a region in which the first sub-sensing electrode 210s1, the second sub-sensing electrode 210s2, the third sub-sensing electrode 220s1, and the fourth sub-sensing electrode 220s2 are not located, a dummy pattern 200fp may be located. The dummy pattern 200fp may be a pattern electrically floated.

According to some example embodiments of the inventive concept, the first sub-sensing electrode 210s1, the second sub-sensing electrode 210s2, the sensing patterns 220sp, and the dummy pattern 200fp may be located on the same layer. The bridge patterns 220sb may be electrically insulated from the first sub-sensing electrode 210s1 and the second sub-sensing electrode 210s2. Therefore, the bridge patterns 220sb may be located on a different layer from the first sub-sensing electrode 210s1 and the second sub-sensing electrode 210s2.

For example, the bridge patterns 220sb may be included in the first conductive layer 202 (see, e.g., FIG. 4), and the first sub-sensing electrode 210s1, the second sub-sensing electrode 210s2, the sensing patterns 220sp, and the dummy pattern 200fp may be included in the second conductive layer 204 (see, e.g., FIG. 4). However, the embodiments according to the inventive concept are not limited thereto. According to some example embodiments of the inventive concept, the bridge patterns 220sb may be included in the second conductive layer 204 (see, e.g., FIG. 4), and the first sub-sensing electrode 210s1, the second sub-sensing electrode 210s2, the sensing patterns 220sp, and the dummy pattern 200fp may be included in the first conductive layer 202 (see, e.g., FIG. 4).

The first sub-sensing electrode 210s1, the second sub-sensing electrode 210s2, the sensing patterns 220sp, and the dummy pattern 200fp may have a mash structure. FIG. 7 illustrates a portion of the dummy pattern 200fp, a portion of the sensing pattern 220sp, and a portion of the second sub-sensing electrode 210s2. An opening 220op defined by the mesh structure may overlap the light emitting region PXA described with reference to FIG. 4.

Figure 8A:
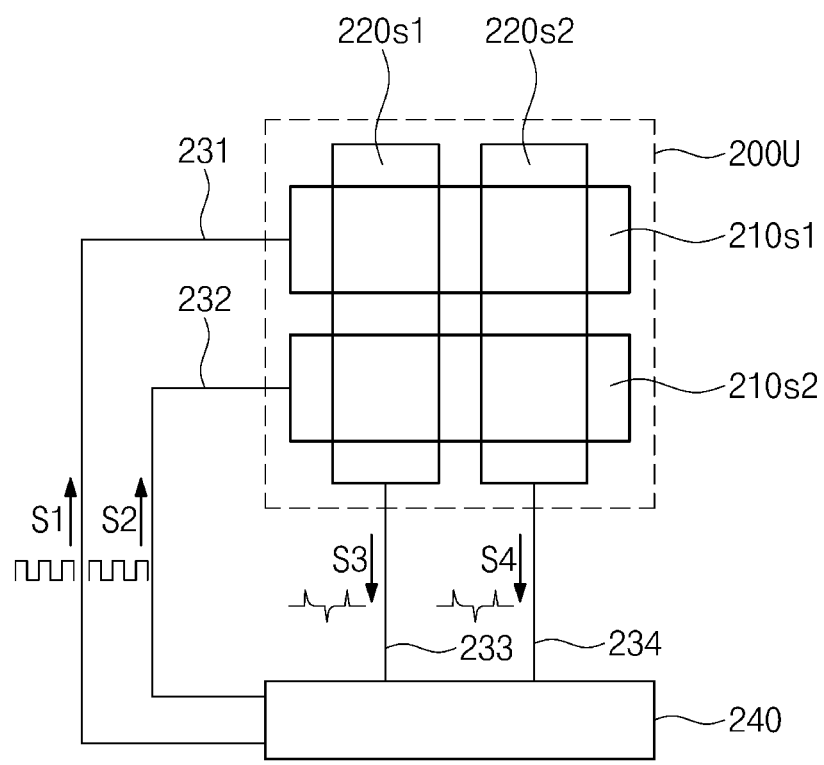
FIG. 8A is a view for describing the operation of a sensor layer in a first mode according to some example embodiments.
Figure 8B:
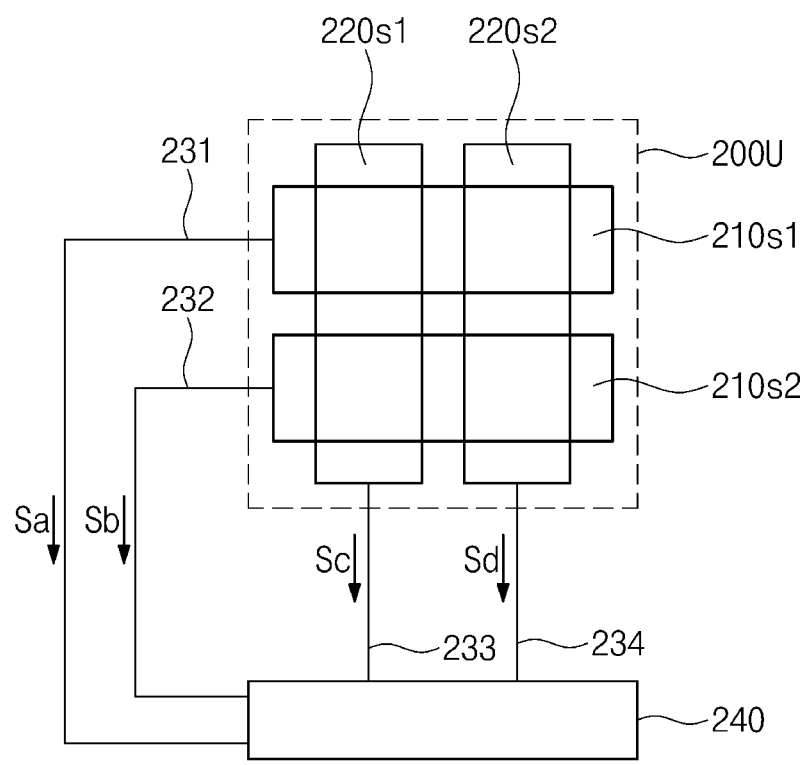
FIG. 8B is a view for describing the operation of a sensor layer in a second mode according to some example embodiments.

FIG. 8A is a view for describing the operation of a sensor layer in a first mode. FIG. 8B is a view for describing the operation of a sensor layer in a second mode.

Each of FIG. 8A and FIG. 8B illustrates an example of one sensing unit 200U and a sensor driving circuit 240.

Referring to FIG. 5, FIG. 8A, and FIG. 8b, the sensor driving circuit 240 is a circuit for controlling the operation of the sensor layer 200, and may include at least one driving chip. The sensor driving circuit 240 may be provided in the form of a circuit board on which a chip is mounted, and the sensor driving circuit 240 may be electrically connected to the sensor layer 200 illustrated in FIG. 5.

One sensing unit 200U may include a portion of one first sensing electrode 210 and a portion of one second sensing electrode 220. Each of the first sensing electrode 210 and the second sensing electrode 220 may be divided into at least two sub-sensing electrodes.

Referring to FIG. 5 and FIG. 8A, in the first mode, the first sensing electrode 210 may operate as a TX electrode and the second sensing electrode 220 may operate as an RX electrode. In the first mode, the sensor driving circuit 240 may sense an external input by sensing the amount of change in mutual capacitance formed between the first sensing electrode 210 and the second sensing electrode 220.

The sensor driving circuit 240 may provide a driving signal to the first sensing electrode 210. According to some example embodiments of the inventive concept, the first sensing electrode 210 includes the first sub-sensing electrode 210s1 and the second sub-sensing electrode 210s2. Therefore, the sensor driving circuit 240 may provide a first signal S1 to the first sub-sensing electrode 210s1 and may provide a second signal S2 to the second sub-sensing electrode 210s2. The first signal S1 and the second signal S2 may have the same waveform, and the first signal S1 and the second signal S2 may be simultaneously provided to each of the first sub-sensing electrode 210s1 and the second sub-sensing electrode 210s2.

The sensor driving circuit 240 may receive a sensing signal from the second sensing electrode 220. According to some example embodiments of the inventive concept, the second sensing electrode 220 includes the third sub-sensing electrode 220s1 and the fourth sub-sensing electrode 220s2, the third sub-sensing electrode 220s1 and the fourth sub-sensing electrode 220s2 may be electrically separated from each other. Therefore, the sensor driving circuit 240 may receive a first sensing signal S3 from the third sub-sensing electrode 220s1 and may receive a second sensing signal S4 from the fourth sub-sensing electrode 220s2.

The sensor driving circuit 240 may have an algorithm for summing the first sensing signal S3 and the second sensing signal S4. That is, the sensor driving circuit 240 may sum the first sensing signal S3 and the second sensing signal S4.

When the second sensing electrode 220 is not divided into the third sub-sensing electrode 220s1 and the fourth sub-sensing electrode 220s2, a waveform of a signal received from the second sensing electrode 220 may be substantially the same as the sum of a waveform of a signal received from the third sub-sensing electrode 220s1 and a waveform of a signal received from the fourth sub-sensing electrode 220s2. Therefore, even when the second sensing electrode 220 is divided into the third sub-sensing electrode 220s1 and the fourth sub-sensing electrode 220s2, the mutual capacitance and the amount of change in mutual capacitance between the first sensing electrode 210 and the second sensing electrode 220 may be none or insignificance.

That is, according to some example embodiments of the inventive concept, the first sub-sensing electrode 210s1 and the second sub-sensing electrode 210s2 electrically separated from each other in the sensor layer 200 and the third sub-sensing electrode 220s1 and the fourth sub-sensing electrode 220s2 electrically separated from each other in the sensor layer 200 may define one sensing unit node.

Referring to FIG. 8B, when the active pen 2000 (see, e.g., FIG. 3) approaches the sensor layer 200 (see, e.g., FIG. 3), the sensor layer 200 (see, e.g., FIG. 3) may enter an active pen 2000 (see, e.g., FIG. 3) sensing mode (i.e., the second mode) from the first mode.

In the active pen 2000 (see, e.g., FIG. 3) sensing mode, each of the first sensing electrode 210 and the second sensing electrode 220 may sense a TX signal provided from the active pen 2000 (see, e.g., FIG. 3) and output a sensing signal having a modified waveform to the sensor driving circuit 240. For example, in the second mode, the sensor driving circuit 240 may receive a first sensing signal Sa from the first sub-sensing electrode 210$s$1, a second sensing signal Sb from the second sub-sensing electrode 210$s$2, a third sensing signal Sc from the third sub-sensing electrode 220$s$1, and a fourth sensing signal Sd from the fourth sub-sensing electrode 220$s$2.

That is, when the sensor layer 200 (see, e.g., FIG. 3) enters the active pen 2000 (see, e.g., FIG. 3) sensing mode, the first sensing electrode 210 and the second sensing electrode 220 may all operate as the RX electrodes.

According to some example embodiments of the inventive concept, the first sensing electrode 210 may be electrically separated into the first sub-sensing electrode 210$s$1 and the second sub-sensing electrode 210$s$2, and the second sensing electrode 220 may be electrically separated into the third sub-sensing electrode 220$s$1 and the fourth sub-sensing electrode 220$s$2. Therefore, a parasitic capacitance component which each of the first sub-sensing electrode 210$s$1 and the second sub-sensing electrode 210$s$2 has may be reduced to equal to or less than half compared to the first sensing electrode before being separated. In addition, a parasitic capacitance component which each of the third sub-sensing electrode 220$s$1 and the fourth sub-sensing electrode 220$s$2 has may also be reduced to equal to or less than half compared to the second sensing electrode before being divided. That is, as the parasitic capacitive component is reduced, the sensing sensitivity of the sensor layer 200 may be improved.

Figure 9:
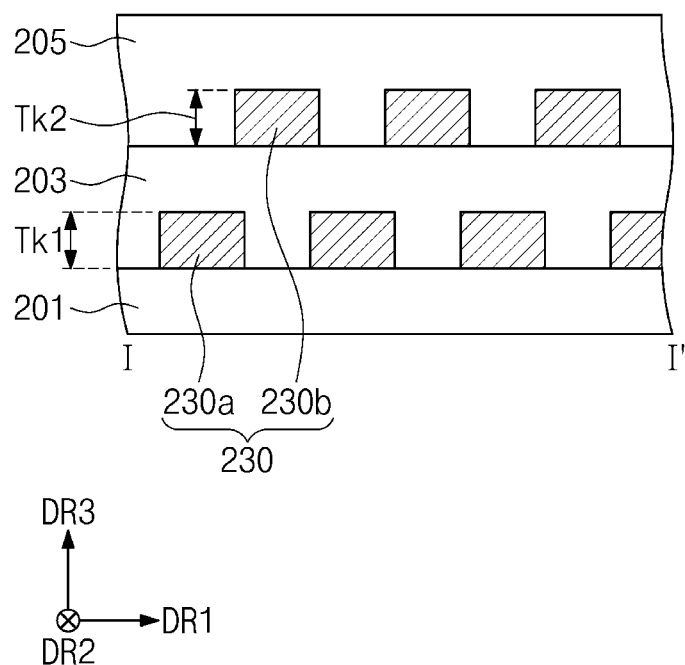
FIG. 9 is a cross-sectional view taken along the line I-I' illustrated in FIG. 5 according to some example embodiments of the inventive concept.

FIG. 9 is a cross-sectional view taken along the line I-I' illustrated in FIG. 5 according to some example embodiments of the inventive concept.

Referring to FIG. 5 and FIG. 9, one first sensing electrode 210 is divided into at least two sub-sensing electrodes (e.g., first and second sub-sensing electrodes 210$s$1 and 210$s$2), and the sensing lines 230 are connected to the first and second sub-sensing electrodes 210$s$1 and 210$s$2, respectively. That is, the number of the sensing lines 230 located in the peripheral region 200N may increase.

In order to secure a region in which the sensing lines 230 are to be located, some of the sensing lines 230$a$ (hereinafter, first sensing lines) among the sensing lines 230 may be located between the base layer 201 and the sensing insulation layer 203, and the other sensing lines 230$b$ (hereinafter, second sensing lines) among the sensing lines 230 may be located between the sensing insulation layer 203 and the cover insulation layer 205.

When viewed in the third direction DR3, the first sensing lines 230$a$ and the second sensing lines 230$b$ may be alternately arranged one by one. Therefore, the size of parasitic capacitance which may be generated between the first sensing lines 230$a$ and the second sensing lines 230$b$ may be reduced or the parasitic capacitance may be eliminated.

Each of the first sensing lines 230$a$ and the second sensing lines 230$b$ may be composed of one conductive layer. For example, the first sensing lines 230$a$ may be included in the first conductive layer 202 (see, e.g., FIG. 4), and the second sensing lines 230$b$ may be included in the second conductive layer 204 (see, e.g., FIG. 4). In this case, in order to compensate for the increase in resistance when compared to a case in which a line pattern included in the first conductive layer 202 (see, e.g., FIG. 4) and a line pattern included in the second conductive layer 204 (see, e.g., FIG. 4) are all included, thicknesses Tk1 and Tk2 of the first sensing lines 230$a$ and the second sensing lines 230$b$ may be provided to be equal to or greater than a thickness (e.g., a set or predetermined thickness). A thickness Tk1 of the first sensing lines 230$a$ may be provided to be in a level similar to a thickness Tk2 of the second sensing lines 230$b$.

According to some example embodiments of the inventive concept, even when the thicknesses Tk1 and Tk2 of the first sensing lines 230$a$ and the second sensing lines 230$b$ are increased, the first sensing lines 230$a$ may be covered by the sensing insulation layer 203 including an organic material, and the second sensing lines 230$b$ may be covered by the cover insulation layer 205 including an organic material. Because the thickness of the sensing insulation layer 203 may be greater when the sensing insulation layer 203 includes an organic material than when the sensing insulation layer 203 includes an inorganic material, the probability that the first sensing lines 230$a$ and the second sensing lines 230$b$ are short-circuited to each other may be reduced or eliminated.

Figure 10:
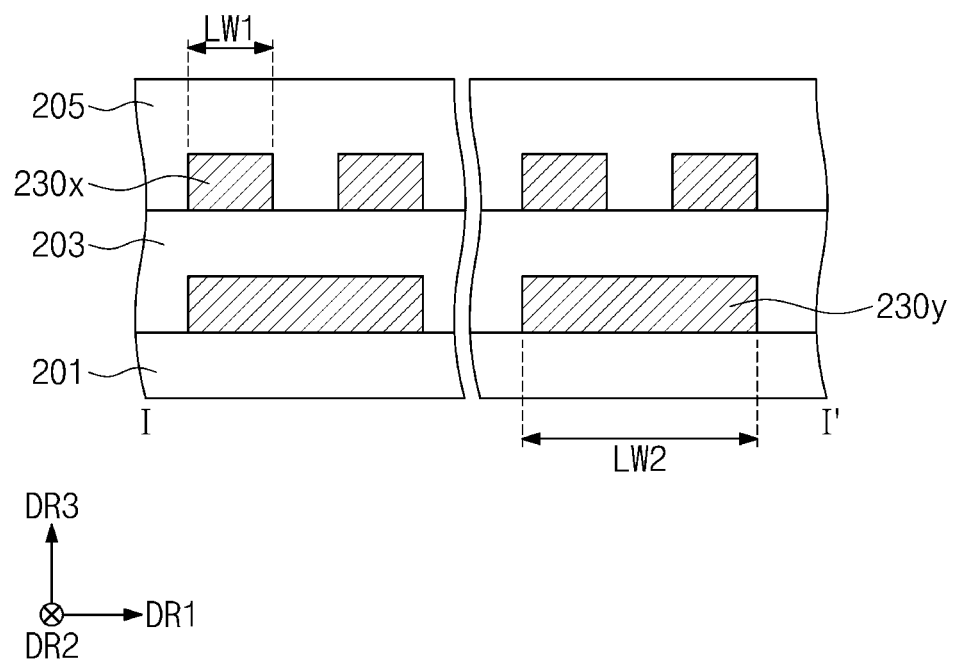
FIG. 10 is a cross-sectional view taken along the line I-I' illustrated in FIG. 5 according to some example embodiments of the inventive concept.

FIG. 10 is a cross-sectional view taken along the line I-I' illustrated in FIG. 5 according to some example embodiments of the inventive concept.

Referring to FIG. 5 and FIG. 10, some sensing lines 230$x$ (hereinafter, a first sensing line) among the sensing lines 230 may be located between the sensing insulation layer 203 and the cover insulation layer 205, and the other sensing lines 230$y$ (hereinafter, a second sensing line) among the sensing lines 230 may be located between the base layer 201 and the sensing insulation layer 203.

A width LW1 of the first sensing line 230$x$ in the first direction DR1 may be less than a width LW2 of the second sensing line 230$y$ in the first direction DR1. Referring to FIG. 5, the length of the second sensing line 230$y$ may be greater than the length of the first sensing line 230$x$. Therefore, by providing the width LW2 of the second sensing line 230$y$ to be greater than the width LW1 of the first sensing line 230$x$, it is possible to decrease the difference between the resistance of the second sensing line 230$y$ and the resistance of the first sensing line 230$x$.

According to some example embodiments of the inventive concept, unlike what is illustrated in FIG. 10, the first sensing line 230$x$ may be located between the base layer 201 and the sensing insulation layer 203, and the second sensing line 230$y$ may be located between the sensing insulation layer 203 and the cover insulation layer 205.

In addition, according to some example embodiments of the inventive concept, the sensor layer 200 further include, in addition to the embodiments described and illustrated with respect to in FIG. 9 and FIG. 10, a line layer located on the cover insulation layer 205 and an additional cover insulation layer for covering the line layer.

Figure 11:
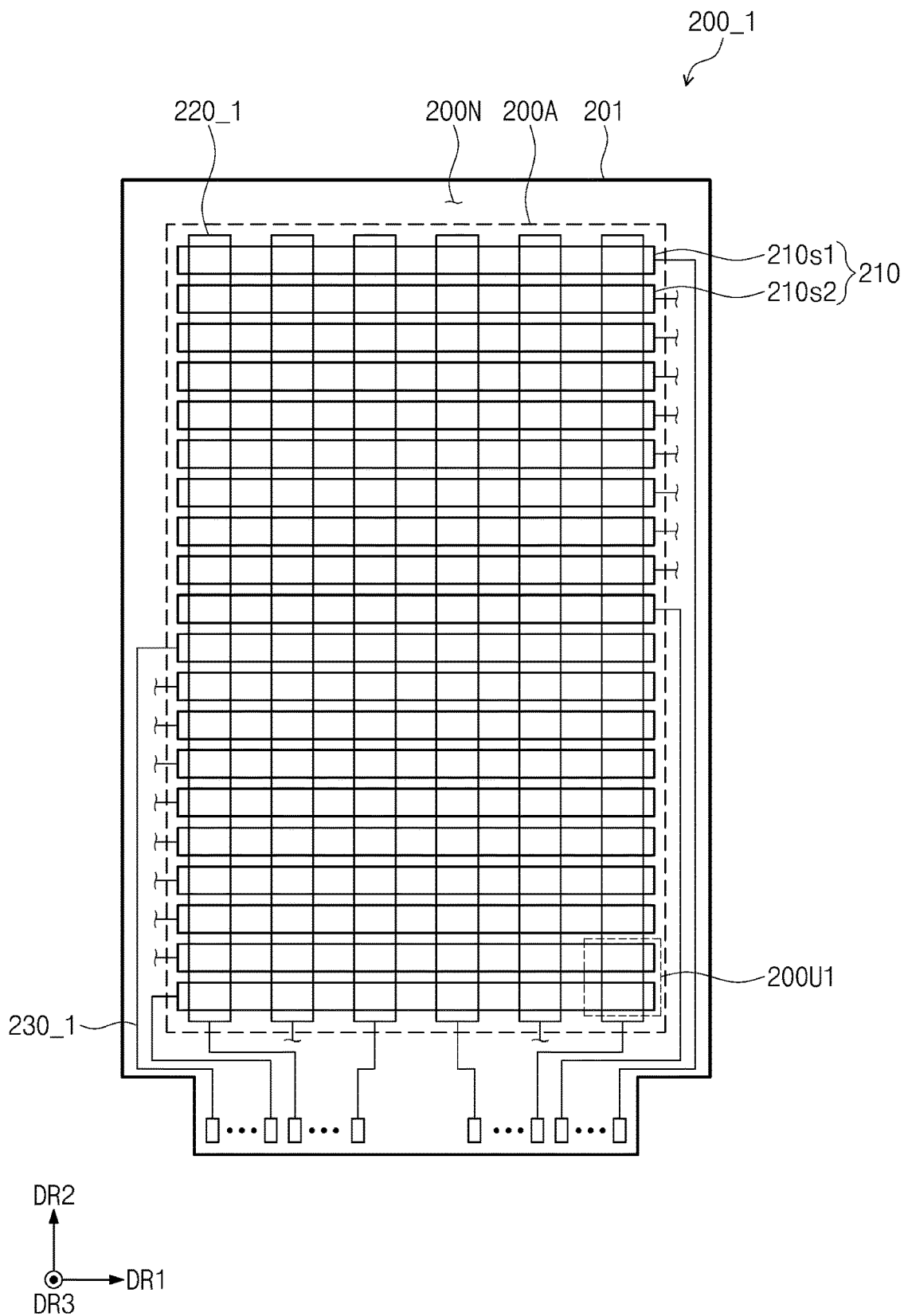
FIG. 11 is a plan view illustrating a sensor layer according to some example embodiments of the inventive concept.
Figure 12:
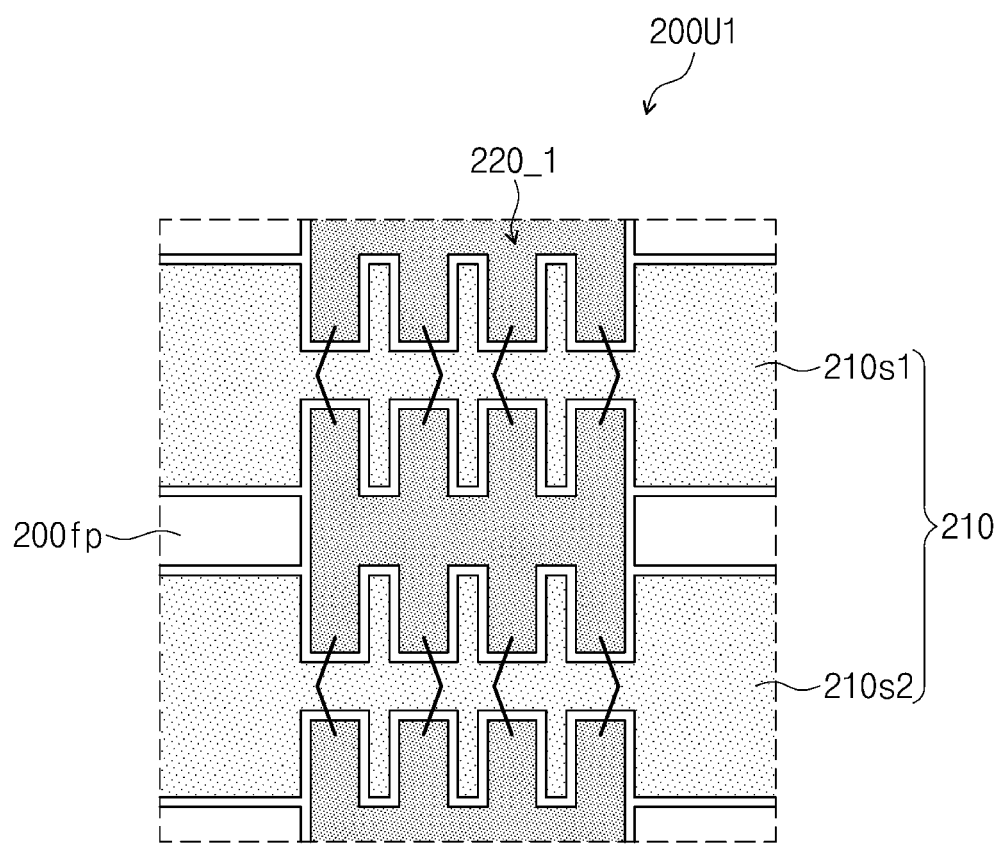
FIG. 12 is a plan view illustrating an enlarged view of a portion of the sensor layer illustrated in FIG. 11 according to some example embodiments.

FIG. 11 is a plan view illustrating a sensor layer according to some example embodiments of the inventive concept. FIG. 12 is a plan view illustrating an enlarged view of a portion of the sensor layer illustrated in FIG. 11.

Referring to FIG. 11 and FIG. 12, a sensor layer 200_1 may include a plurality of the first sensing electrodes 210 (hereinafter, first sensing electrodes), a plurality of second sensing electrodes 2201 (hereinafter, second sensing electrodes), and a plurality of sensing lines 230_1. The first sensing electrodes 210 and the second sensing electrodes 220_1 may be located in the sensing region 200A. The sensing lines 230_1 may be located in the peripheral region 200N.

The first sensing electrodes 210 may include a first sub-sensing electrode 210s1 and a second sub-sensing electrode 210s2. One sensing unit 200U1 may include the first sub-sensing electrode 210s1, the second sub-sensing electrode 210s2, and one second sensing electrode 220_1.

The sensor layer 200_1 may be operated in a first mode in which information on an external input is obtained through the change in mutual capacitance between the first sensing electrode 210 and the second sensing electrode 220_1, or in a second mode in which an input by the active pen 2000 (see, e.g., FIG. 3) is sensed through the change in capacitance of each of the first sensing electrode 210 and the second sensing electrode 220_1.

When operated in the first mode, the same driving signal may be simultaneously provided to the first sub-sensing electrode 210s1 and the second sub-sensing electrode 210s2. Thereafter, a sensor driving circuit may receive a sensing signal from the second sensing electrode 220_1.

When operated in the second mode, each of the first sub-sensing electrode 210s1 and the second sensing electrode 220_1 may sense a TX signal provided from the active pen 2000 (see, e.g., FIG. 3) and output a sensing signal having a modified waveform to the sensor driving circuit.

According to some example embodiments of the inventive concept, the first sub-sensing electrode 210s1 and the second sub-sensing electrode 210s2 simultaneously provided with the same signal in the first mode may be electrically separated in the sensor layer 200. Therefore, a maximum parasitic capacitance component generated between the sensor layer 200 and the second electrode CE (see, e.g., FIG. 4) may be reduced. Accordingly, the sensing sensitivity of the sensor layer 200_1 may be improved.

Figure 13:
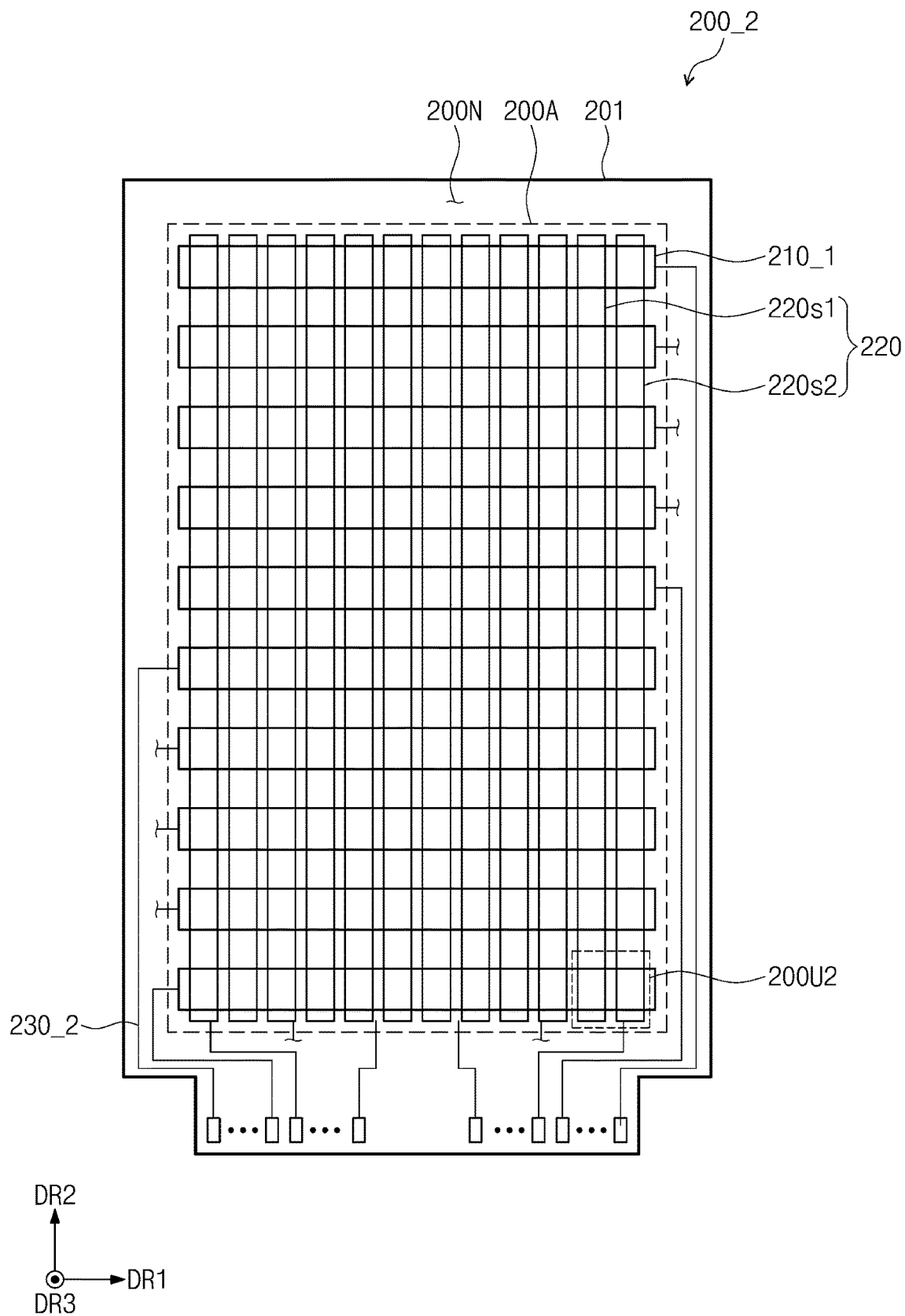
FIG. 13 is a plan view illustrating a sensor layer according to some example embodiments of the inventive concept.
Figure 14:
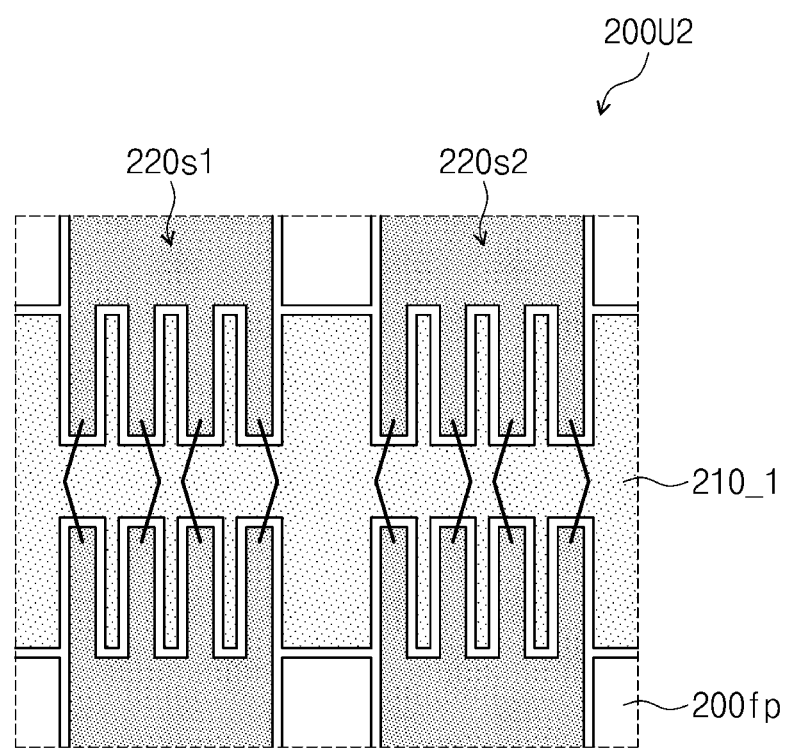
FIG. 14 is a plan view illustrating an enlarged view of a portion of the sensor layer illustrated in FIG. 13 according to some example embodiments.

FIG. 13 is a plan view illustrating a sensor layer according to some example embodiments of the inventive concept. FIG. 14 is a plan view illustrating an enlarged view of a portion of the sensor layer illustrated in FIG. 13.

Referring to FIG. 13 and FIG. 14, a sensor layer 200_2 may include a plurality of first sensing electrodes 210_1 (hereinafter, first sensing electrodes), a plurality of the second sensing electrodes 220 (hereinafter, second sensing electrodes), and a plurality of sensing lines 230_2. The first sensing electrodes 210_1 and the second sensing electrodes 220 may be located in the sensing region 200A. The sensing lines 230_2 may be located in the peripheral region 200N.

The second sensing electrodes 220 may include the third sub-sensing electrode 220s1 and the fourth sub-sensing electrode 220s2. One sensing unit 200U2 may include the third sub-sensing electrode 220s1, the fourth sub-sensing electrode 220s2, and one first sensing electrode 210_1.

The sensor layer 200_2 may be operated in a first mode in which information on an external input is obtained through the change in mutual capacitance between the first sensing electrode 210_1 and the second sensing electrode 220, or in a second mode in which an input by the active pen 2000 (see, e.g., FIG. 3) is sensed through the change in capacitance of each of the first sensing electrode 210_1 and the second sensing electrode 220.

When operated in the first mode, a driving signal may be provided to the first sensing electrode 210_1. Thereafter, a sensor driving circuit receives a sensing signal from each of the third sub-sensing electrode 220s1 and the fourth sub-sensing electrode 220s2. The sensor driving circuit may sum a sensing signal respectively received from the third sub-sensing electrode 220s1 and the fourth sub-sensing electrode 220s2.

When operated in the second mode, each of the first sensing electrode 210_1, the third sub-sensing electrode 220s1, and the fourth sub-sensing electrode 220s2 may sense a TX signal provided from the active pen 2000 (see, e.g., FIG. 3) and output a sensing signal having a modified waveform to the sensor driving circuit.

According to some example embodiments of the inventive concept, the third sub-sensing electrode 220s1 and the fourth sub-sensing electrode 220s2 outputting a signal summed in the sensor driving circuit in the first mode may be electrically separated in the sensor layer 200_2. Therefore, a maximum parasitic capacitance component generated between the sensor layer 200_2 and the second electrode CE (see, e.g., FIG. 3) may be reduced. Accordingly, the sensing sensitivity of the sensor layer 200_2 may be improved.

Figure 15:
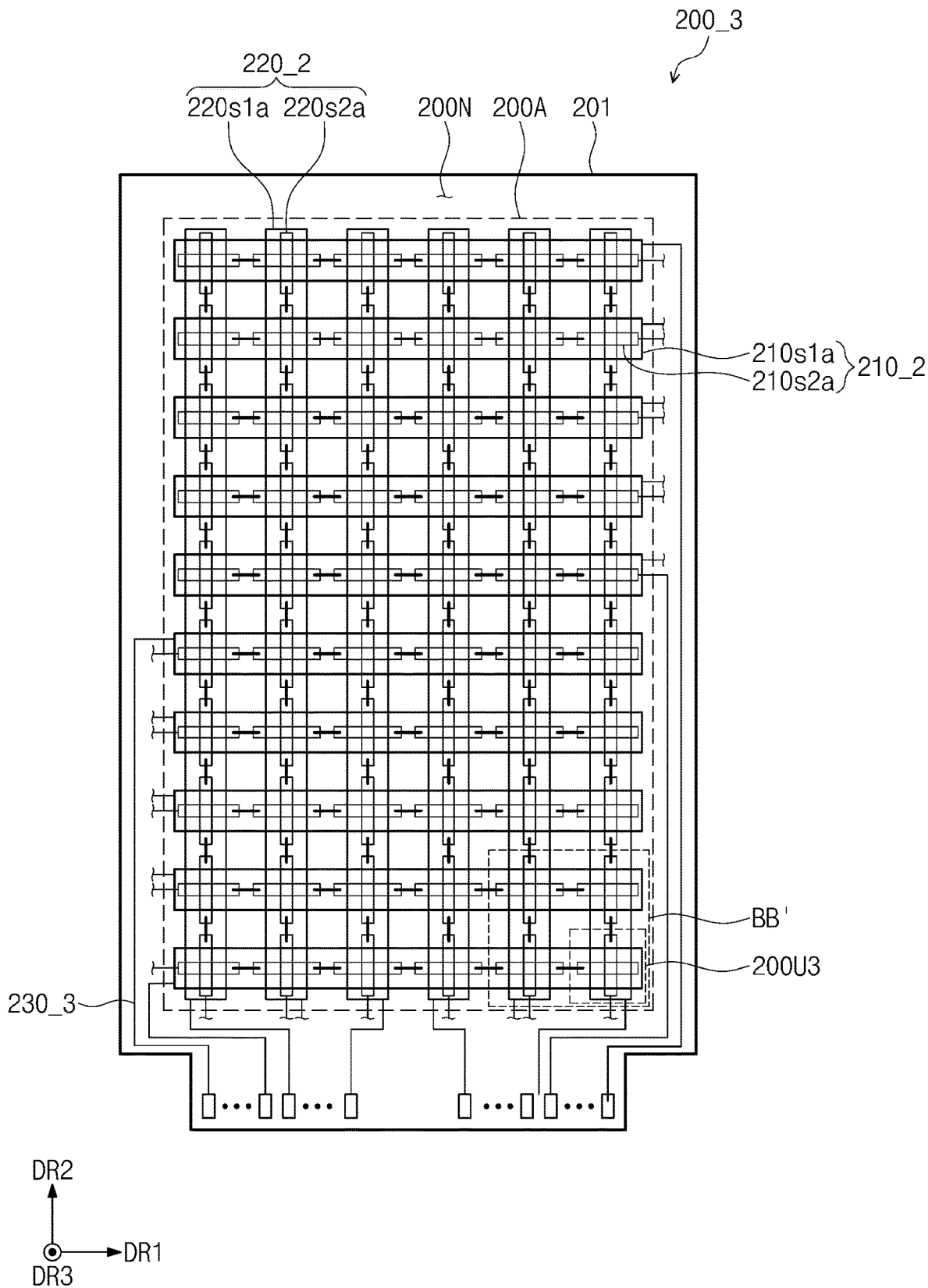
FIG. 15 is a plan view illustrating a sensor layer according to some example embodiments of the inventive concept.
Figure 16:
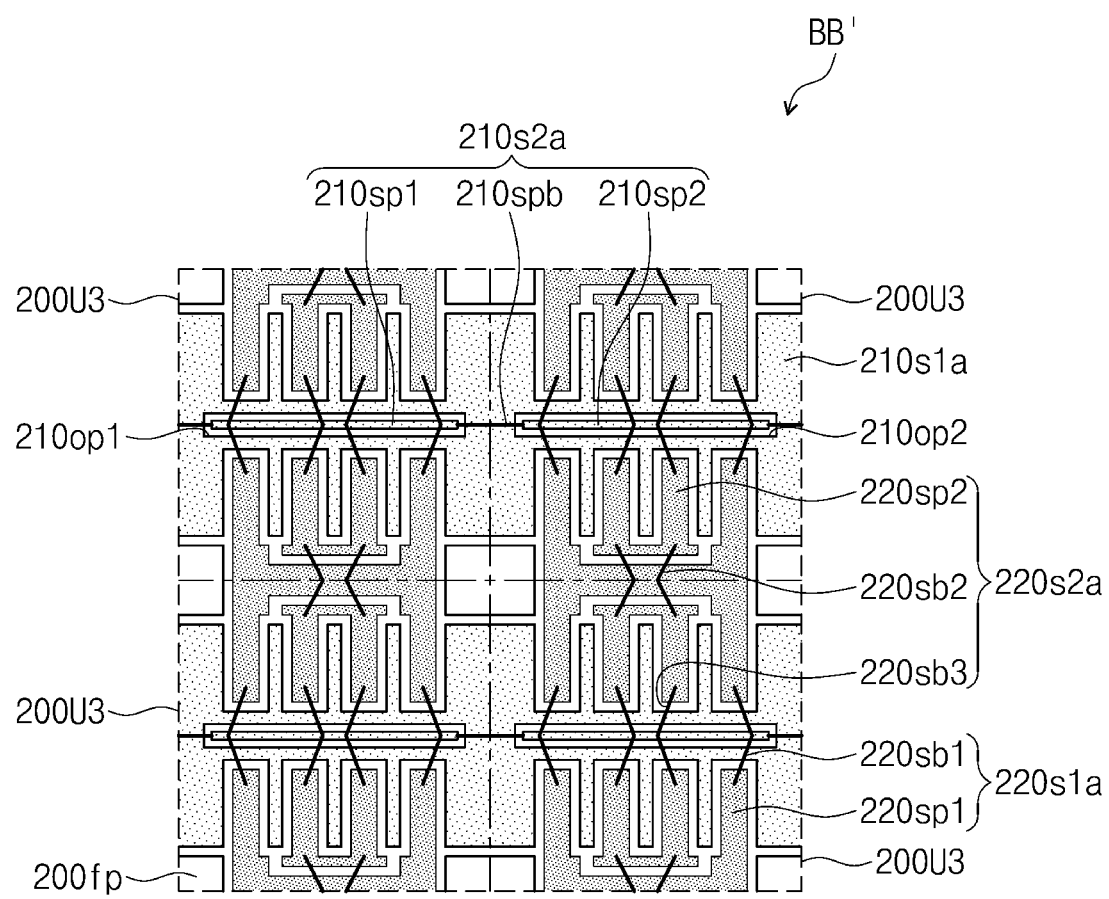
FIG. 16 is a plan view illustrating an enlarged view of the area BB' of FIG. 15 according to some example embodiments.

FIG. 15 is a plan view illustrating a sensor layer according to some example embodiments of the inventive concept. FIG. 16 is a plan view illustrating an enlarged view of the area BB' of FIG. 15. In FIG. 16, four sensing units 200U3 are illustrated.

Referring to FIG. 15 and FIG. 16, a sensor layer 200_3 may include a plurality of first sensing electrodes 2102 (hereinafter, first sensing electrodes), a plurality of second sensing electrodes 2202 (hereinafter, second sensing electrodes), and a plurality of sensing lines 230_3. The first sensing electrodes 210_2 and the second sensing electrodes 220_2 may be located in the sensing region 200A. The sensing lines 230_3 may be located in the peripheral region 200N.

The first sensing electrodes 210_2 may include a first sub-sensing electrode 210s1a and a second sub-sensing electrode 210s2a electrically separated in the sensor layer 2003. Each of the second sensing electrodes 220_2 may include a third sub-sensing electrode 220s1a and a fourth sub-sensing electrode 220s2a electrically separated in the sensor layer 200_3.

The first sub-sensing electrode 210s1a may have a shape surrounding the second sub-sensing electrode 210s2a, and the third sub-sensing electrode 220s1a may have a shape surrounding the fourth sub-sensing electrode 220s2a. For example, the second sub-sensing electrode 210s2a may be located between a portion of the first sub-sensing electrode 210s1a and the other portion of the first sub-sensing electrode 210s1a. In addition, the fourth sub-sensing electrode 220s2a may be located between a portion of the third sub-sensing electrode 220s1a and the other portion of the third sub-sensing electrode 220s1a.

The sensor layer 200_3 may be operated in a first mode in which information on an external input is obtained through the change in mutual capacitance between the first sensing electrode 210_2 and the second sensing electrode 220_2, or in a second mode in which an input by the active pen 2000 (see, e.g., FIG. 3) is sensed through the change in capacitance of each of the first sensing electrode 210_2 and the second sensing electrode 220_2.

When operated in the first mode, the same driving signal may be simultaneously provided to the first sub-sensing electrode 210s1a and the second sub-sensing electrode 210s2a. Thereafter, a sensor driving circuit receives a sensing signal from each of the third sub-sensing electrode 220s1a and the fourth sub-sensing electrode 220s2a. The sensor driving circuit may sum sensing signals received from the third sub-sensing electrode 220s1a and the fourth sub-sensing electrode 220s2a.

When operated in the second mode, each of the first sub-sensing electrode 210s1a, the second sub-sensing electrode 210s2a, the third sub-sensing electrode 220s1a, and the fourth sub-sensing electrode 220s2a may sense a TX signal provided from the active pen 2000 (see, e.g., FIG. 3) and output a sensing signal having a modified waveform to the sensor driving circuit.

According to some example embodiments of the inventive concept, the first sub-sensing electrode 210s1a and the second sub-sensing electrode 210s2a simultaneously provided with the same signal in the first mode may be electrically separated in the sensor layer 200_3. In addition, the third sub-sensing electrode 220s1a and the fourth sub-sensing electrode 220s2a outputting a signal summed in the sensor driving circuit in the first mode may be electrically separated in the sensor layer 200_3. Therefore, a maximum parasitic capacitance component generated between the sensor layer 200_3 and the second electrode CE (see, e.g., FIG. 3) may be reduced. Accordingly, the sensing sensitivity of the sensor layer 200_3 may be improved.

In the first sub-sensing electrode 210s1a, a plurality of openings may be defined. The plurality of openings may include a first opening 210op1 and a second opening 210op2. The first opening 210op1 and the second opening 2100p2 may be spaced apart along an extension direction of the first sub-sensing electrode 210s1a and defined. The first opening 210op1 and the second opening 2100p2 may be spaced apart along the first direction DR1.

The second sub-sensing electrode 210s2a may include a first sub-sensing pattern 210sp1, a second sub-sensing pattern 210sp2, and a sub-bridge pattern 210spb. The first sub-sensing pattern 210sp1 may be located in the first opening 210op1, and the second sub-sensing pattern 210sp2 may be located in the second opening 210op2. The sub-bridge pattern 210spb may be connected to the first sub-sensing pattern 210sp1 and the second sub-sensing pattern 210sp2 spaced apart from each other.

The third sub-sensing electrode 220s1a may include a plurality of first sensing patterns 220sp1 and a plurality of bridge patterns 220sb1. The fourth sub-sensing electrode 220s2a may include a plurality of second sensing patterns 220sp2, and a plurality of first bridge patterns 220sb2, and a plurality of second bridge patterns 220sb3.

One second sensing pattern 220sp2 may be located between one first sensing pattern 220sp1 and one first sub-sensing electrode 210s1a. Two adjacent second sensing patterns 220sp2 may be spaced apart from each other having the first sensing pattern 220sp1 interposed therebetween, or may be spaced apart from each other having the first sub-sensing electrode 210s1a interposed therebetween.

The first bridge patterns 220sb2 may be connected to two second sensing patterns 220sp2 spaced apart from each other having the first sensing pattern 220sp1 interposed therebetween, and the second bridge patterns 220sb3 may be connected to two second sensing patterns 220sp2 spaced apart from each other having the first sub-sensing electrode 210s1a interposed therebetween. That is, the first bridge patterns 220sb2 may overlap the first sensing patterns 220sp1, and the second bridge patterns 220sb3 may overlap the first sub-sensing electrode 210s1a.

According to some example embodiments of the inventive concept, the sub-bridge pattern 210spb, the plurality of bridge patterns 220sb1, the plurality of first bridge patterns 220sb2, and the plurality of second bridge patterns 220sb3 are located on the same layer, and may not overlap each other. The first sub-sensing electrode 210s1a, the first sub-sensing pattern 210sp1, the second sub-sensing pattern 210sp2, the plurality of first sensing patterns 220sp1, and the plurality of second sensing patterns 220sp2 are located on the same layer, and may not overlap each other.

Figure 17:
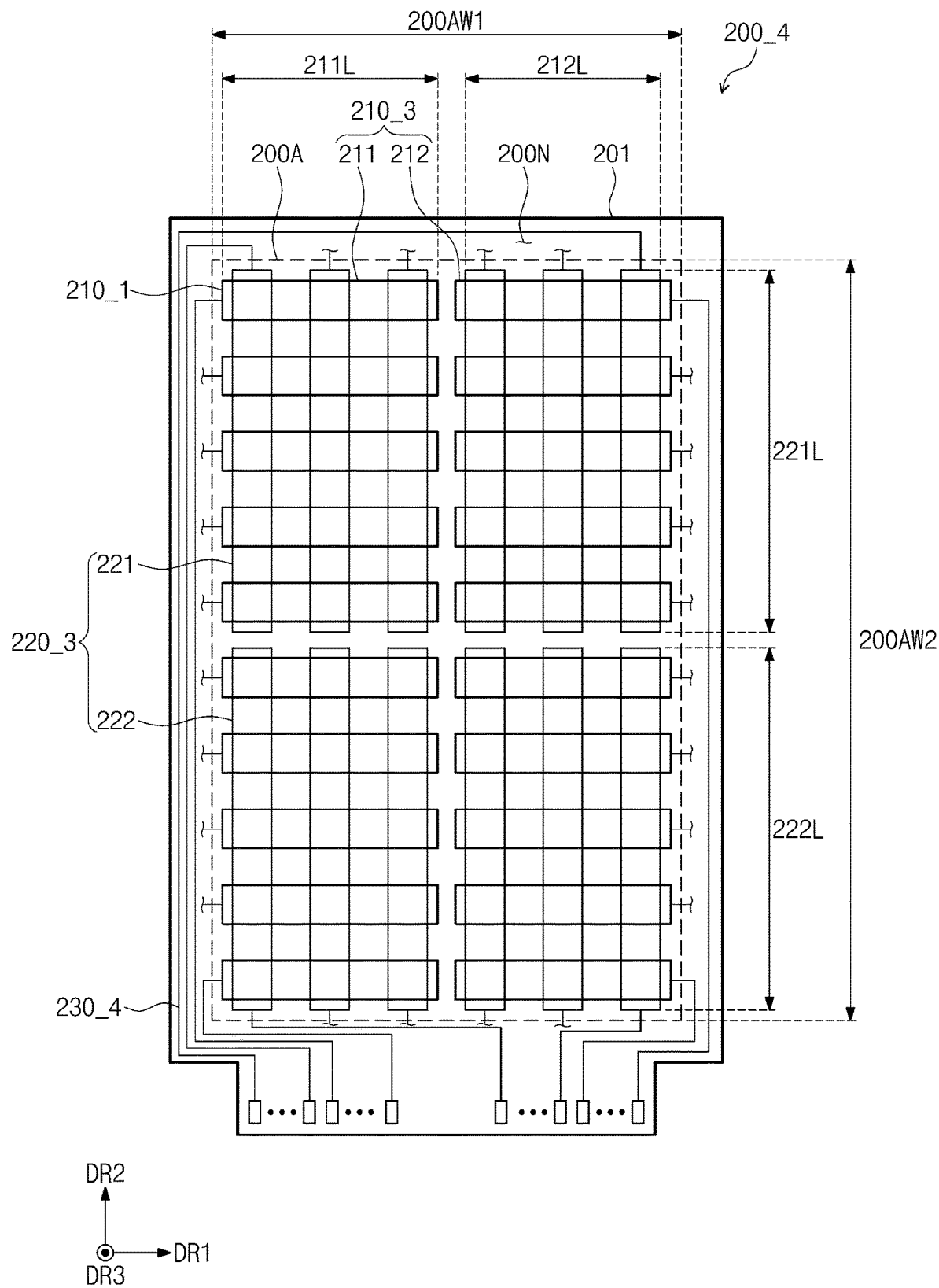
FIG. 17 is a plan view of a sensor layer according to some example embodiments of the inventive concept.

FIG. 17 is a plan view of a sensor layer according to some example embodiments of the inventive concept.

Referring to FIG. 17, a sensor layer 200_4 may include a plurality of first sensing electrodes 210_3 (hereinafter, first sensing electrodes), a plurality of second sensing electrodes 2203 (hereinafter, second sensing electrodes), and a plurality of sensing lines 230_4. The first sensing electrodes 210_3 and the second sensing electrodes 220_3 may be located in the sensing region 200A. The sensing lines 230_4 may be located in the peripheral region 200N.

Each of the first sensing electrodes 210_3 may include a first sub-sensing electrode 211 and a second sub-sensing electrode 212. Each of the second sensing electrodes 220 may include a third sub-sensing electrode 221 and a fourth sub-sensing electrode 222.

The first sub-sensing electrode 211 and the second sub-sensing electrode 212 may be electrically separated in the sensor layer 200_4, and the third sub-sensing electrode 221 and the fourth sub-sensing electrode 222 may be electrically separated in the sensor layer 200_4. Therefore, the maximum parasitic capacitance generated in the sensor layer 200_4 may be reduced.

Each of the first sub-sensing electrode 211 and the second sub-sensing electrode 212 may be extended along the first direction DR1. The first sub-sensing electrode 211 and the second sub-sensing electrode 212 may be spaced apart along the first direction DR1.

Each of the third sub-sensing electrode 221 and the fourth sub-sensing electrode 222 may be extended along the second direction DR2. The third sub-sensing electrode 221 and the fourth sub-sensing electrode 222 may be spaced apart along the second direction DR2.

If the first sub-sensing electrode 211 intersects the third sub-sensing electrode 221, the second sub-sensing electrode 212 may not intersect the third sub-sensing electrode 221 intersecting the first sub-sensing electrode 211. That is, the second sub-sensing electrode 212 may be spaced apart from the third sub-sensing electrode 221 intersecting the first sub-sensing electrode 211. In addition, the second sub-sensing electrode 212 may be also spaced apart from the fourth sub-sensing electrode 222 intersecting the first sub-sensing electrode 211.

A length 211L of the first sub-sensing electrode 211 in the first direction DR1 and a length 212L of the second sub-sensing electrode 212 in the first direction DR1 may be substantially the same. In addition, the width 200AW1 of the sensing region 200A in the first direction DR1 may be greater than each of the length 211L of the first sub-sensing electrode 211 in the first direction DR1 and the length 212L of the second sub-sensing electrode 212 in the first direction DR1. The width 200AW1 of the sensing region 200A in the first direction DR1 may be greater than or substantially the same as the sum of the length 211L of the first sub-sensing electrode 211 in the first direction DR1 and the length 212L of the second sub-sensing electrode 212 in the first direction DR1.

A length 221L of the third sub-sensing electrode 221 in the second direction DR2 and a length 222L of the fourth sub-sensing electrode 222 in the second direction DR2 may be substantially the same. In addition, the width 200AW2 of the sensing region 200A in the second direction DR2 may be greater than each of the length 221L of the third sub-sensing electrode 221 in the second direction DR2 and the length 222L of the fourth sub-sensing electrode 222 in the second direction DR2. The width 200AW2 of the sensing region 200A in the second direction DR2 may be greater than or substantially the same as the sum of the length 221L of the third sub-sensing electrode 221 in the second direction DR2 and the length 222L of the fourth sub-sensing electrode 222 in the second direction DR2.

The sensor layer 200_4 may be operated in a first mode in which information on an external input is obtained through the change in mutual capacitance between the first sensing electrode 210_3 and the second sensing electrode 220_3, or in a second mode in which an input by the active pen 2000 (see, e.g., FIG. 3) is sensed through the change in capacitance of each of the first sensing electrode 210_3 and the second sensing electrode 220_3.

When operated in the first mode, the same driving signal may be simultaneously provided to the first sub-sensing electrode 211 and the second sub-sensing electrode 212. Thereafter, a sensor driving circuit may receive a sensing signal from the second sensing electrode 220_3. Unlike the embodiments described above with reference to FIG. 5 to FIG. 15, the third sub-sensing electrode 221 and the fourth sub-sensing electrode 222 of the second sensing electrode 220_3 may be included in a different sensing unit. Therefore, the sensor driving circuit may sense sensing signals of the third sub-sensing electrode 221 and the fourth sub-sensing electrode 222, respectively, and calculate position coordinates.

When operated in the second mode, each of the first sub-sensing electrode 211, the second sub-sensing electrode 212, the third sub-sensing electrode 221, and the fourth sub-sensing electrode 222 may sense a TX signal provided from the active pen 2000 (see, e.g., FIG. 3) and output a sensing signal having a modified waveform to the sensor driving circuit.

Figure 18:
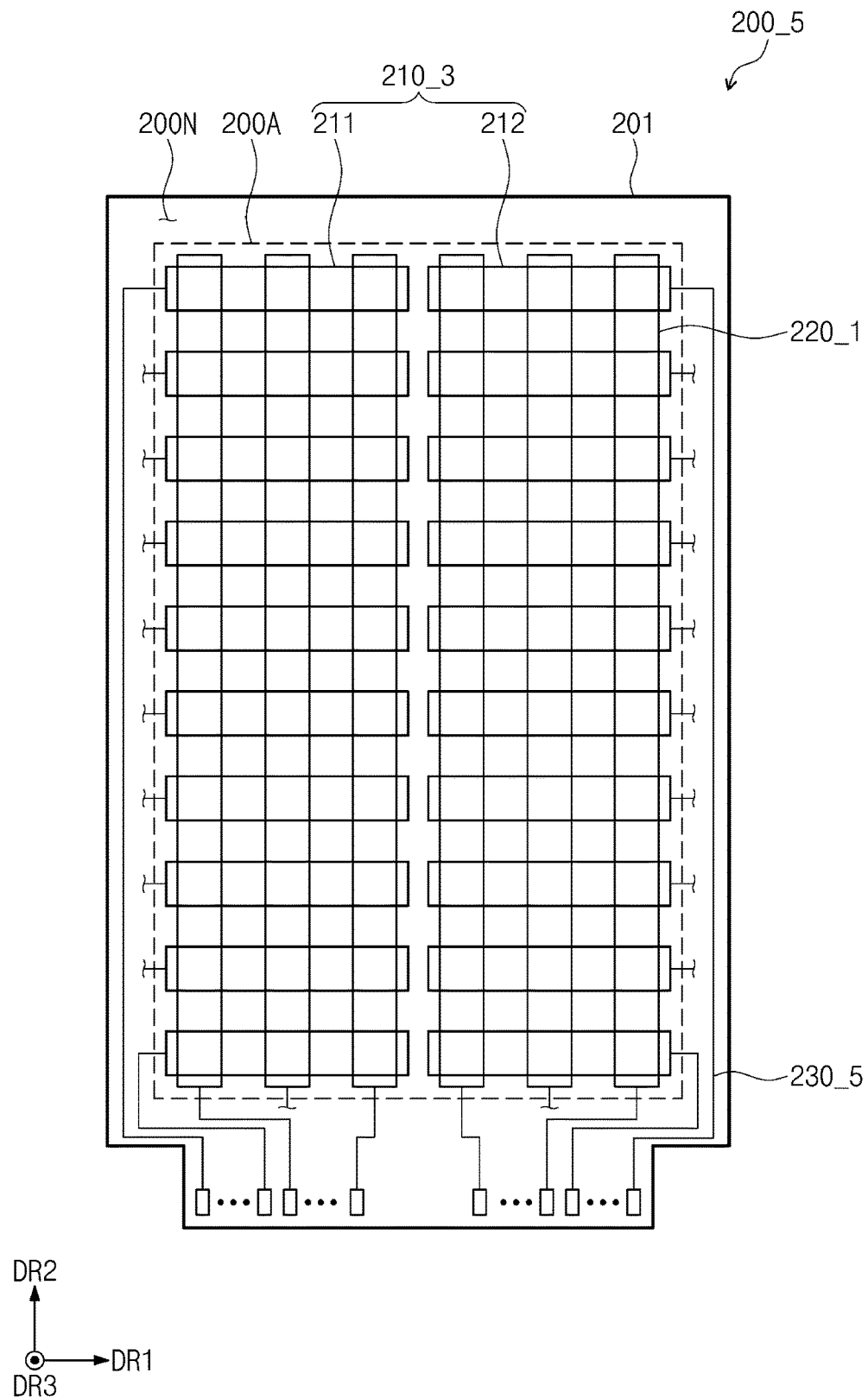
FIG. 18 is a plan view of a sensor layer according to some example embodiments of the inventive concept.

FIG. 18 is a plan view of a sensor layer according to some example embodiments of the inventive concept.

Referring to FIG. 18, a sensor layer 200_5 may include a plurality of the first sensing electrodes 210_3 (hereinafter, first sensing electrodes), a plurality of the second sensing electrodes 2201 (hereinafter, second sensing electrodes), and a plurality of sensing lines 230_5. The first sensing electrodes 210_3 and the second sensing electrodes 220_1 may be located in the sensing region 200A. The sensing lines 230_5 may be located in the peripheral region 200N.

The first sensing electrode 210_3 may be the same as the first sensing electrodes 210_3 described with reference to FIG. 17, and the second sensing electrodes 220_1 may be the same as the second sensing electrodes 220_1 described with reference to FIG. 11.

According to some example embodiments of the inventive concept, the second sensing electrodes 220_1 may be substituted by the second sensing electrodes 220 illustrated in FIG. 5 or the second sensing electrodes 220_2 illustrated in FIG. 15.

Figure 19:
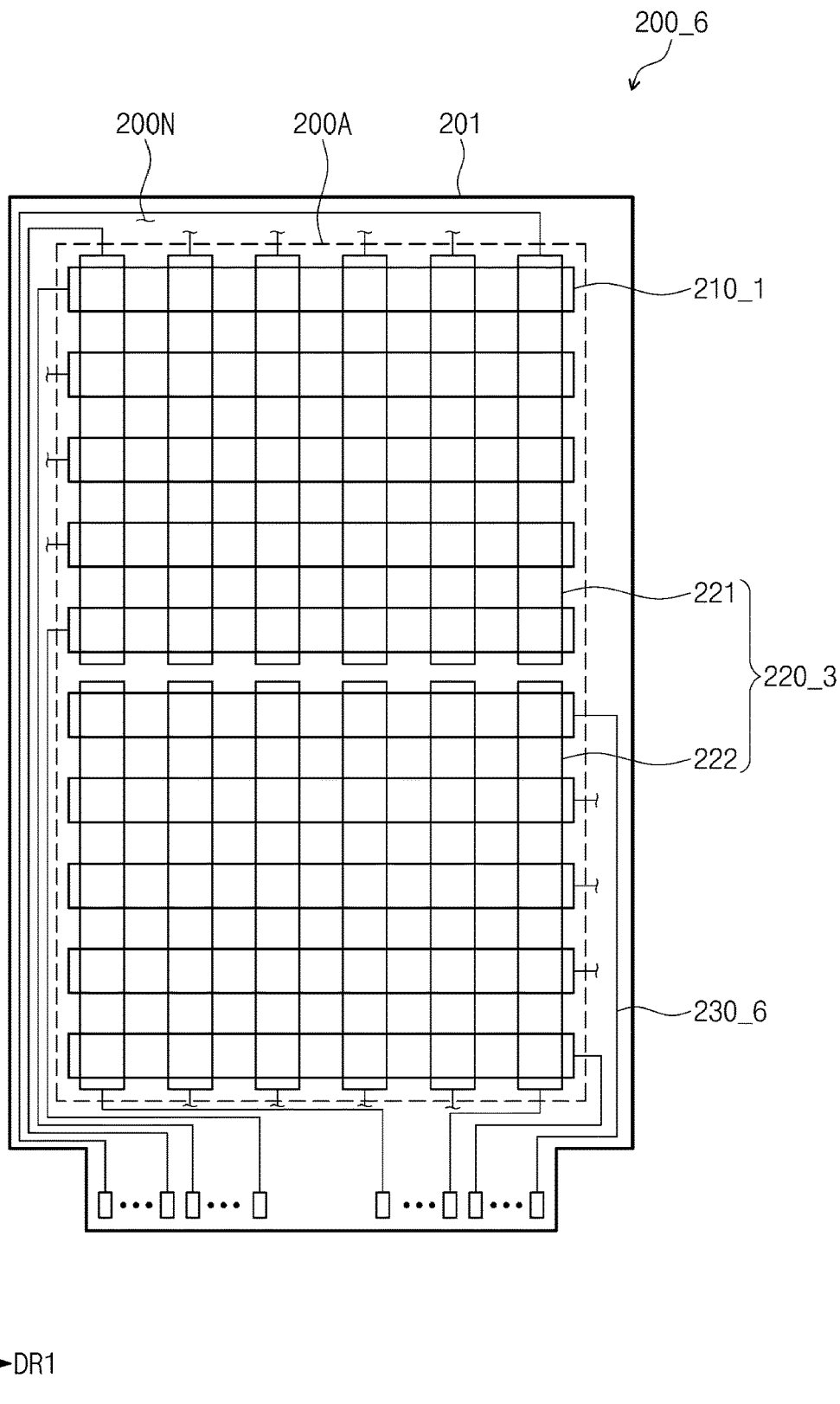
FIG. 19 is a plan view of a sensor layer according to some example embodiments of the inventive concept.

FIG. 19 is a plan view of a sensor layer according to some example embodiments of the inventive concept.

Referring to FIG. 19, a sensor layer 200_6 may include a plurality of the first sensing electrodes 210_1 (hereinafter, first sensing electrodes), a plurality of the second sensing electrodes 220_3 (hereinafter, second sensing electrodes), and a plurality of sensing lines 230_6. The first sensing electrodes 210_1 and the second sensing electrodes 220_3 may be located in the sensing region 200A. The sensing lines 230_6 may be located in the peripheral region 200N.

The first sensing electrode 210_1 may be the same as the first sensing electrodes 210_1 described with reference to FIG. 13, and the second sensing electrodes 220_3 may be same as the second sensing electrodes 220_3 described with reference to FIG. 17.

According to some example embodiments of the inventive concept, the first sensing electrodes 210_1 may be substituted by the first sensing electrodes 210 illustrated in FIG. 5 or the first sensing electrodes 210_2 illustrated in FIG. 15.

Figure 20:
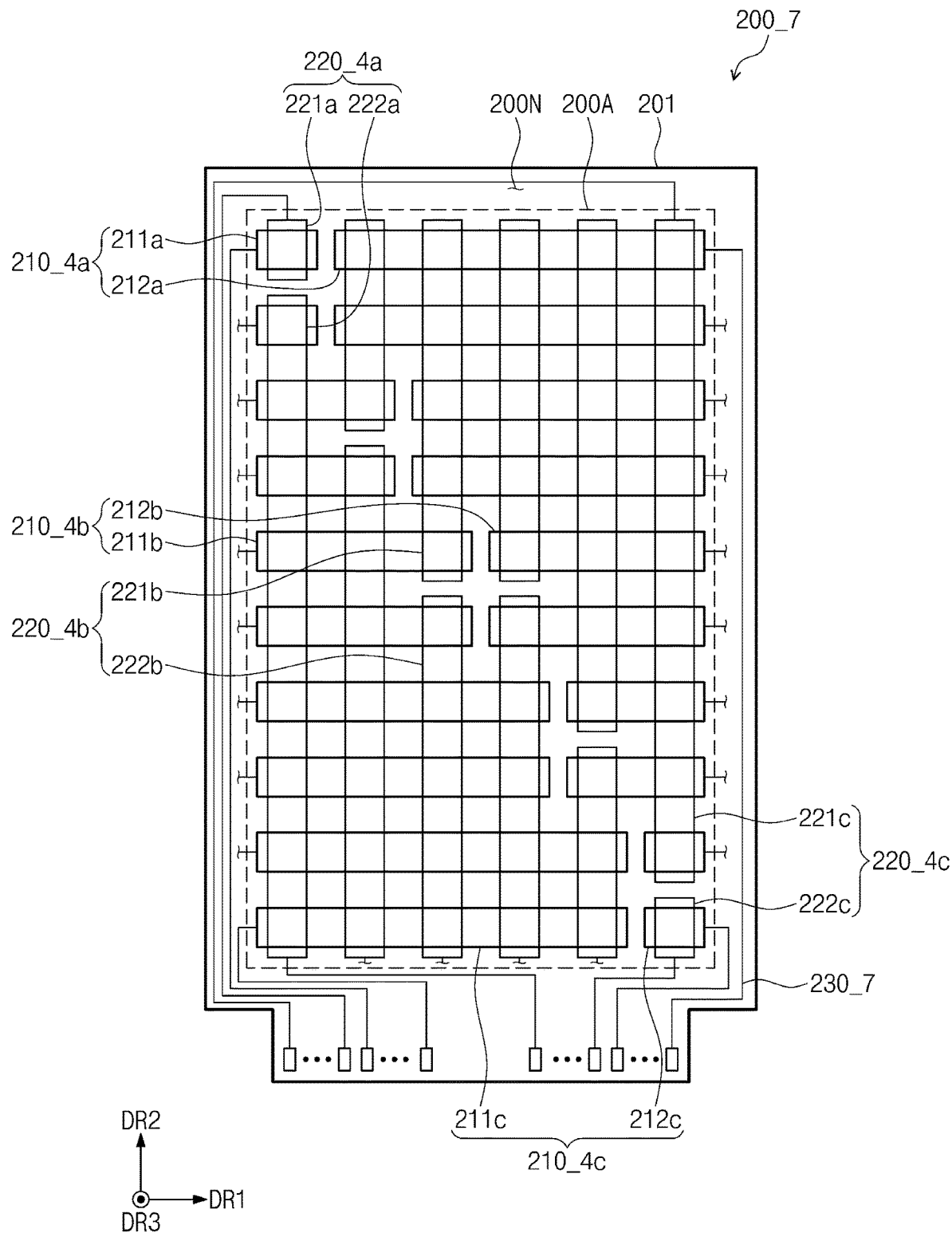
FIG. 20 is a plan view of a sensor layer according to some example embodiments of the inventive concept.

FIG. 20 is a plan view of a sensor layer according to some example embodiments of the inventive concept.

Referring to FIG. 20, a sensor layer 200_7 may include a plurality of first sensing electrodes 210_4*a*, 210_4*b*, and 210_4*c*, a plurality of second sensing electrodes 220_4*a*, 220_4*b*, and 220_4*c*, and a plurality of sensing lines 230_7. The plurality of the first sensing electrodes 210_4*a*, 210_4*b*, and 210_4*c* and the plurality of the second sensing electrodes 220_4*a*, 220_4*b*, and 220_4*c* may be located in the sensing region 200A. The sensing lines 230_7 may be located in the peripheral region 200N.

A first sensing electrode 210_4*a* may include a first sub-sensing electrode 211*a* and a second sub-sensing electrode 212*a*, a first sensing electrode 210_4*b* may include a first sub-sensing electrode 211*b* and a second sub-sensing electrode 212*b*, and a first sensing electrode 210_4*c* may include a first sub-sensing electrode 211*c* and a second sub-sensing electrode 212*c*. When different reference numerals are used for components having the same component name, it should be understood that the components are different components with reference to the description and drawings.

The length of the first sub-sensing electrode 211*a* in the first direction DR1 may be less than the length of the second sub-sensing electrode 212*a* in the first direction DR1. The length of the first sub-sensing electrode 211*b* in the first direction DR1 may be the same as the length of the second sub-sensing electrode 212*b* in the first direction DR1. The length of the first sub-sensing electrode 211*c* in the first direction DR1 may be greater than the length of the second sub-sensing electrode 212*c* in the first direction DR1.

A second sensing electrode 220_4*a* may include a third sub-sensing electrode 221*a* and a fourth sub-sensing electrode 222*a*, a second sensing electrode 220_4*b* may include a third sub-sensing electrode 221*b* and a fourth sub-sensing electrode 222*b*, and a second sensing electrode 220_4*c* may include a third sub-sensing electrode 221*c* and a fourth sub-sensing electrode 222*c*.

The length of the third sub-sensing electrode 221*a* in the second direction DR2 may be less than the length of the fourth sub-sensing electrode 222*a* in the second direction DR2. The length of the third sub-sensing electrode 221*b* in the second direction DR2 may be the same as the length of the fourth sub-sensing electrode 222*b* in the second direction DR2. The length of the third sub-sensing electrode 221*c* in the second direction DR2 may be greater than the length of the fourth sub-sensing electrode 222*c* in the second direction DR2.

A sensor layer may be operated in a first mode in which information on an external input is obtained through the change in mutual capacitance between a first sensing electrode and a second sensing electrode, or in a second mode in which an input by an active pen is sensed through the change in capacitance of each of the first sensing electrode and the second sensing electrode. At least one of the first sensing electrode or the second sensing electrode may be separated into a plurality of sub-sensing electrodes. The plurality of sub-sensing electrodes may be electrically separated in the sensor layer. Therefore, the maximum parasitic capacitance generated between the sensor layer and a common electrode in a display layer may be reduced, and accordingly, the sensing sensitivity of the sensor layer may be improved.

Although the inventive concept has been described with reference to some example embodiments of the inventive concept, it will be understood by those skilled in the art that various changes in form and details may be made therein without departing from the spirit and scope of the inventive concept. Accordingly, the technical scope of the inventive concept is not intended to be limited to the contents set forth in the detailed description of the specification, but is intended to be defined by the appended claims and their equivalents.

What is claimed is:

1. An electronic device comprising:
a display layer;
a sensor layer on the display layer; and
a sensor driving circuit configured to drive the sensor layer,
wherein the sensor layer includes:
a first sensing electrode having a first sub-sensing electrode and a second sub-sensing electrode electrically separated from the first sub-sensing electrode; and
a second sensing electrode having a third sub-sensing electrode and a fourth sub-sensing electrode, and intersecting the first sensing electrode,
wherein the sensor driving circuit is configured to simultaneously provide a same signal to the first sub-sensing electrode and the second sub-sensing electrode to sense an external input and to sum a sensing signal received from the third sub-sensing electrode and a sensing signal received from the fourth sub-sensing electrode, and
the sensor driving circuit is further configured to receive sensing signals from the first sub-sensing electrode, the second sub-sensing electrode, the third sub-sensing electrode, and the fourth sub-sensing electrode, respectively, to sense an input by an active pen.

2. The electronic device of claim 1, wherein:
each of the first sub-sensing electrode and the second sub-sensing electrode extends along a first direction;
the second sensing electrode extends along a second direction intersecting the first direction;
the first sub-sensing electrode and the second sub-sensing electrode are spaced apart from each other along the second direction; and
each of the first sub-sensing electrode and the second sub-sensing electrode intersects the second sensing electrode.

3. The electronic device of claim 1, wherein:
a first opening and a second opening spaced apart from the first opening are in the first sub-sensing electrode; and
the second sub-sensing electrode comprises a first sub-sensing pattern in the first opening and electrically insulated from the first sub-sensing electrode, a second sub-sensing pattern in the second opening and electrically insulated from the first sub-sensing electrode, and a sub-bridge pattern connecting the first sub-sensing pattern and the second sub-sensing pattern.

4. The electronic device of claim 1, wherein a length of the first sub-sensing electrode is equal to or greater than a length of the second sub-sensing electrode.

5. The electronic device of claim 1, wherein:
each of the first sub-sensing electrode and the second sub-sensing electrode extends along a first direction;
each of the third sub-sensing electrode and the fourth sub-sensing electrode extends along a second direction intersecting the first direction; and
each of the first sub-sensing electrode and the second sub-sensing electrode intersects the third sub-sensing electrode and the fourth sub-sensing electrode.

6. The electronic device of claim 1, wherein the display layer comprises:
a base layer;
a circuit layer on the base layer;
a light emitting element layer on the circuit layer and the light emitting element layer including a first electrode, an emission layer on the first electrode, and a second electrode on the emission layer; and
an encapsulation layer on the light emitting element layer, wherein the sensor layer is directly on the encapsulation layer.

7. The electronic device of claim 1, wherein:
the sensor layer has a sensing region in which the first sensing electrode and the second sensing electrode are located and a peripheral region adjacent to the sensing region; and
the sensor layer further comprises a first sensing line electrically connected to the first sub-sensing electrode, a second sensing line electrically connected to the second sub-sensing electrode, and a third sensing line electrically connected to the second sensing electrode, wherein each of the first sensing line, the second sensing line, and the third sensing line is in the peripheral region.

8. The electronic device of claim 7, wherein each of the first sub-sensing electrode and the second sub-sensing electrode extends along a first direction, and a width of the sensing region in the first direction is equal to or greater than a length of the first sub-sensing electrode in the first direction.

9. An electronic device comprising:
a display layer comprising:
a base layer;
a circuit layer on the base layer;
a light emitting element layer on the circuit layer; and
an encapsulation layer on the light emitting element layer; and
a sensor layer on the display layer, the sensor layer having a sensing region and a peripheral region, and the sensor layer comprising:
a first sensing electrode in the sensing region and having a first sub-sensing electrode and a second sub-sensing electrode; and
a second sensing electrode in the sensing region and intersecting the first sensing electrode,
wherein each of the first sub-sensing electrode and the second sub-sensing electrode extends along a first direction;
the second sensing electrode extends along a second direction intersecting the first direction;
the first sub-sensing electrode and the second sub-sensing electrode are spaced apart along the first direction;
the second sensing electrode is provided plural, the first sub-sensing electrode intersects at least one of the second sensing electrodes, and the second sub-sensing electrode is spaced apart from the at least one of the second sensing electrodes, and
the sensor layer is configured to sense an external input through a change in mutual capacitance between the first sensing electrode and the second sensing electrode and the sensor layer is further configured to sense an input by an active pen through a change in capacitance of each of the first sub-sensing electrode, the second sub-sensing electrode, and the second sensing electrode.

10. The electronic device of claim 9, wherein a width of the sensing region in the first direction is equal to or greater than a sum of a length of the first sub-sensing electrode in the first direction and a length of the second sub-sensing electrode in the first direction.

11. The electronic device of claim 9, wherein a length of the first sub-sensing electrode in the first direction is equal to or greater than a length of the second sub-sensing electrode in the first direction.

12. The electronic device of claim 9, further comprising:
 a first sensing line electrically connected to the first sub-sensing electrode and in the peripheral region;
 a second sensing line electrically connected to the second sub-sensing electrode and in the peripheral region; and
 a third sensing line electrically connected to the second sensing electrode and in the peripheral region.

\* \* \* \* \*